United States Patent
Yoon et al.

(10) Patent No.: US 12,354,675 B2
(45) Date of Patent: Jul. 8, 2025

(54) NONVOLATILE MEMORY DEVICE INCLUDING POWER GATING CIRCUIT AND INPUT/OUTPUT CIRCUIT OF A NONVOLATILE MEMORY DEVICE

(71) Applicant: SAMSUNG ELECTRONICS CO., LTD., Suwon-si (KR)

(72) Inventors: Hojun Yoon, Suwon-si (KR); Jinha Hwang, Suwon-si (KR); Seunghoon Lee, Suwon-si (KR); Youngchul Cho, Suwon-si (KR); Youngdon Choi, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 18/100,173

(22) Filed: Jan. 23, 2023

(65) Prior Publication Data
US 2023/0410917 A1 Dec. 21, 2023

(30) Foreign Application Priority Data
Jun. 16, 2022 (KR) .................. 10-2022-0073472

(51) Int. Cl.
*G11C 11/34* (2006.01)
*G11C 16/24* (2006.01)
*G11C 16/30* (2006.01)

(52) U.S. Cl.
CPC .............. *G11C 16/30* (2013.01); *G11C 16/24* (2013.01)

(58) Field of Classification Search
CPC .................................. G11C 16/30; G11C 16/24
USPC ...................................................... 365/185.18
See application file for complete search history.

(56) References Cited

U.S. PATENT DOCUMENTS

| | | | |
|---|---|---|---|
| 7,126,370 B2 | 10/2006 | Bhattacharya | |
| 7,867,858 B2 | 1/2011 | Nallapati et al. | |
| 9,147,451 B2 * | 9/2015 | Chong | G11C 16/10 |
| 9,147,489 B2 * | 9/2015 | Kim | G11C 16/30 |
| 9,281,818 B2 * | 3/2016 | Lim | H03K 19/0016 |
| 9,349,425 B2 * | 5/2016 | Park | G11C 8/08 |
| 9,923,555 B2 | 3/2018 | Wang et al. | |
| 10,607,692 B2 * | 3/2020 | Kim | G11C 16/08 |
| 10,892,750 B2 * | 1/2021 | Lee | H03K 19/018528 |
| 11,449,274 B2 * | 9/2022 | Woo | G06F 3/0679 |
| 11,615,833 B2 * | 3/2023 | Shin | G11C 11/4091 |
| | | | 365/185.21 |
| 11,657,859 B2 * | 5/2023 | Cho | G11C 7/109 |
| | | | 365/233.1 |
| 2006/0238220 A1 | 10/2006 | Chung et al. | |
| 2013/0214813 A1 | 8/2013 | Singh | |
| 2014/0237275 A1 | 8/2014 | Zanotelli et al. | |

(Continued)

*Primary Examiner* — Viet Q Nguyen
(74) *Attorney, Agent, or Firm* — Muir Patent Law, PLLC

(57) ABSTRACT

An input/output circuit of a nonvolatile memory device and a nonvolatile memory device. The input/output circuit of a nonvolatile memory device includes a driver, which is configured to output data from the nonvolatile memory device to a data line, and a power gating circuit, which is connected between the driver and a power terminal or between the driver and a ground terminal and configured to block a leakage current of the driver. The power gating circuit includes a plurality of transistors electrically connected in parallel and having threshold voltages of different magnitudes, respectively.

20 Claims, 13 Drawing Sheets

(56) References Cited

U.S. PATENT DOCUMENTS

2015/0279449 A1* 10/2015 Moriwaki ................ G11C 5/02
                                                                                365/51
2017/0069380 A1* 3/2017 Takahashi ........... G11C 11/1675
2017/0099045 A1* 4/2017 Shin .................... H03K 17/122
2022/0188013 A1* 6/2022 Woo .................... G11C 7/1057

* cited by examiner

NONVOLATILE MEMORY DEVICE INCLUDING POWER GATING CIRCUIT AND INPUT/OUTPUT CIRCUIT OF A NONVOLATILE MEMORY DEVICE

CROSS-REFERENCE TO RELATED APPLICATION

This application claims priority under 35 U.S.C. § 119 to Korean Patent Application No. 10-2022-0073472 filed on Jun. 16, 2022, in the Korean Intellectual Property Office, the entirety of which are incorporated by reference herein.

BACKGROUND

1. Field

Embodiments relate to a memory controller and, more particularly, to a memory system including a memory device and a memory controller and an operating method thereof.

2. Description of the Related Art

Semiconductor memory devices are classified as volatile semiconductor memory devices or nonvolatile semiconductor memory devices. A volatile semiconductor memory device is fast in read and write speeds but loses data stored therein when power is turned off. In contrast, even though power is turned off, a nonvolatile semiconductor memory device retains information stored therein. Therefore, a nonvolatile semiconductor memory device is used to store information that has to be retained regardless of whether power is supplied.

A nonvolatile memory device may include a memory cell area and a peripheral circuit area. The peripheral circuit area may perform an internal operation such that data are stored in the memory cell area. Also, the peripheral circuit area may include an input/output circuit that outputs data read from the memory cell area to the outside. A leakage current may occur in the input/output circuit in the process of transferring data.

SUMMARY

Embodiments are directed to a nonvolatile memory device including a power gating circuit. The power gating circuit may include a plurality of transistors, which are electrically connected in parallel with a pull-down transistor or a pull-up transistor and have different threshold voltages, for the purpose of blocking a leakage current of a driver transmitting data.

Embodiments are directed to an input/output circuit of a nonvolatile memory device. The input/output circuit of a nonvolatile memory device may include a driver, which is configured to output data from the nonvolatile memory device to a data line, and a power gating circuit, which is connected between the driver and a power terminal or between the driver and a ground terminal and configured to block a leakage current of the driver. The power gating circuit may include a plurality of transistors electrically connected in parallel and having threshold voltages of different magnitudes, respectively.

Embodiments are also directed to a nonvolatile memory device that may include: a memory cell array including a plurality of memory cells; a page buffer connected with the memory cell array through bit lines and configured to read data through the bit lines; an input/output circuit including a transmit circuit configured to output the data from the page buffer to the outside; and control logic configured to control the page buffer and the input/output circuit such that the data are transferred through the transmit circuit. The transmit circuit may include: a driver including a pull-down transistor configured to be turned on based on a pull-down signal of the data and a pull-up transistor configured to be turned on based on a pull-up signal of the data; and a power gating circuit configured to block a leakage current of the pull-down transistor or the pull-up transistor. The power gating circuit may include a first transistor having a second threshold voltage greater than a first threshold voltage of the pull-down transistor or the pull-up transistor and at least one second transistor having a threshold voltage different in magnitude from the second threshold voltage. The first transistor and the at least one second transistor may be electrically connected in parallel.

Embodiments are also directed to a nonvolatile memory device that may include: a memory cell array including a plurality of memory cells; a page buffer connected with the memory cell array through bit lines, and configured to read data through the bit lines; an input/output circuit including a transmit circuit configured to output the data from the page buffer to the outside; and control logic configured to control the page buffer and the input/output circuit such that the data are transferred through the transmit circuit. The transmit circuit may include: a pull-down transistor configured to be turned on based on a pull-down signal of the data; a first pull-up transistor configured to be turned on based on a pull-up signal of the data; a second pull-up transistor configured to be turned on based on the pull-up signal of the data; and a power gating circuit configured to block leakage currents of the first pull-up transistor and the second pull-up transistor. The power gating circuit may include a first transistor having a second threshold voltage greater than a first threshold voltage of the first pull-up transistor or the second pull-up transistor and at least one second transistor having a threshold voltage different in magnitude from the second threshold voltage. The first transistor and the at least one second transistor may be electrically connected in parallel. A first end of the first pull-up transistor and a first end of the second pull-up transistor may be connected with a data line, and a second end of the first pull-up transistor and a second end of the second pull-up transistor may be connected with the power gating circuit.

Embodiments of the present disclosure provide a nonvolatile memory device including a power gating circuit including a plurality of transistors, which are electrically connected in parallel with a pull-down transistor or a pull-up transistor and have different threshold voltages, for the purpose of blocking a leakage current of a driver transmitting data.

BRIEF DESCRIPTION OF THE DRAWINGS

Features will become apparent to those of skill in the art by describing in detail example embodiments with reference to the attached drawings in which.

DETAILED DESCRIPTION

Figure 1:
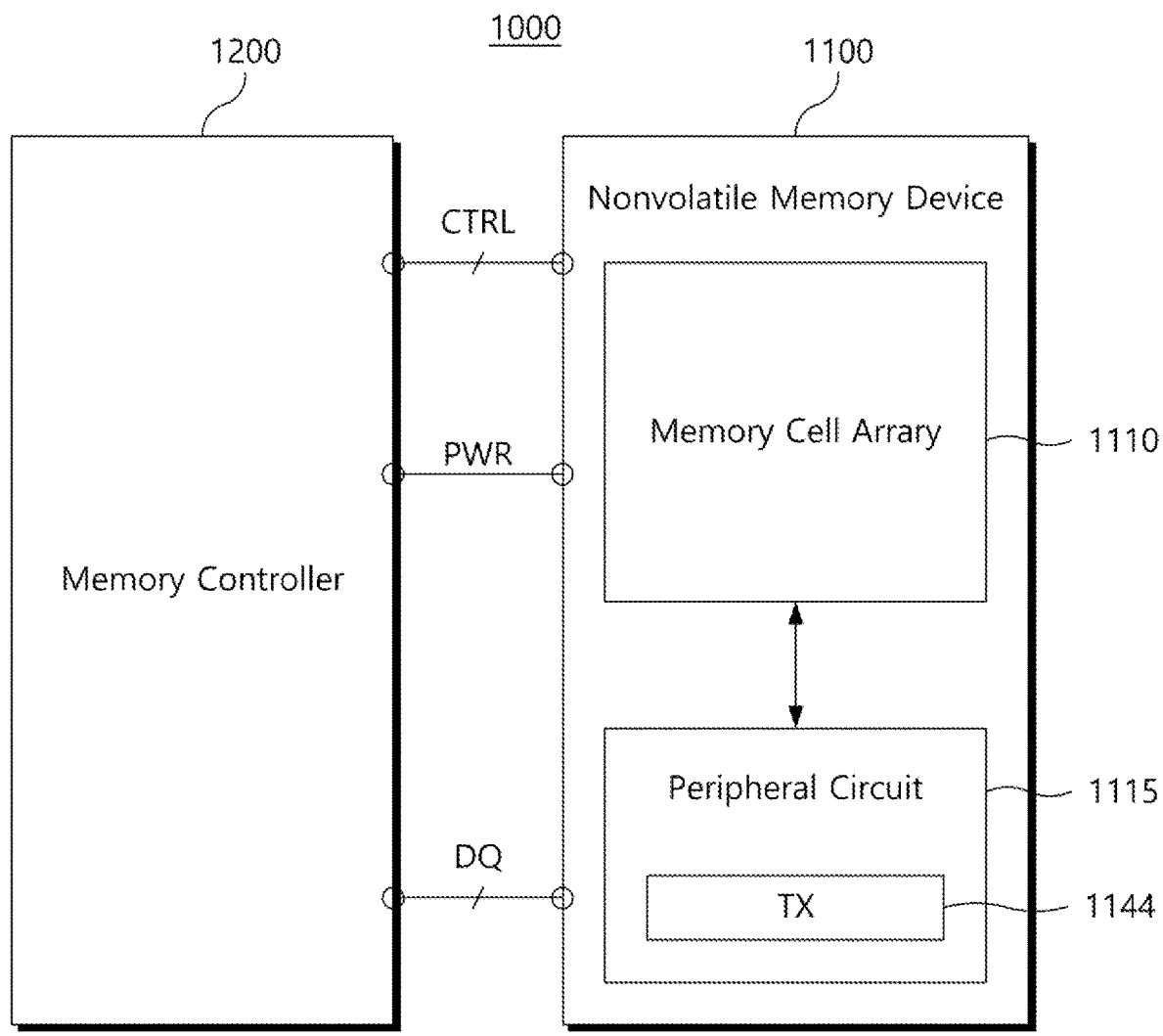
FIG. 1 is a block diagram illustrating a data storage device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a block diagram illustrating a data storage device according to an example embodiment of the present disclosure. Referring to FIG. 1, a data storage device 1000 may include a nonvolatile memory device 1100 and a memory controller 1200. The nonvolatile memory device 1100 and the memory controller 1200 may be connected through a data line DQ, a control line CTRL, and a power line PWR.

According to an example embodiment, the data storage device 1000 may store data in the nonvolatile memory device 1100 under control of the memory controller 1200. The nonvolatile memory device 1100 includes a memory cell array 1110 and a peripheral circuit 1115. The peripheral circuit 1115 may include an analog circuit, digital circuits, or the analog and digital circuits, which are necessary to store data in the memory cell array 1110 or to read data from the memory cell array 1110. The peripheral circuit 1115 may include a transmit circuit 1144 that transmits data read from the memory cell array 1110 to the data line DQ.

According to an example embodiment, the memory cell array 1110 may include a plurality of memory blocks. Each of the memory blocks may have a two-dimensional structure or a vertical three-dimensional structure. Each of the memory blocks may include a plurality of memory cells. Multi-bit data may be stored in each of the memory cells. The memory cell array 1110 may be placed next to the peripheral circuit 1115 or on the peripheral circuit 1115 on a design/layout structure. A structure where the memory cell array 1110 is placed on the peripheral circuit 1115 is called a cell on peripheral (COP) structure.

According to an example embodiment, the memory cell array 1110 may have a pillar structure where a channel diameter (CD) decreases as it goes toward a substrate. Due to a characteristic of the pillar structure of the memory cell array 1110, there is a limitation on stacking memory cells with one stack. For this reason, the nonvolatile memory device 1100 may have a multi-stack structure where two or more stacks are piled.

According to an example embodiment, the peripheral circuit 1115 may be supplied with an external power PWR from the memory controller 1200 and may generate internal powers of various levels. The peripheral circuit 1115 may receive a command, an address, and data from the memory controller 1200 through the data line DQ. The peripheral circuit 1115 may store data in the memory cell array 1110 in response to a control signal CTRL. Also, the peripheral circuit 1115 may read data stored in the memory cell array 1110 and may provide the read data to the memory controller 1200.

Figure 2:
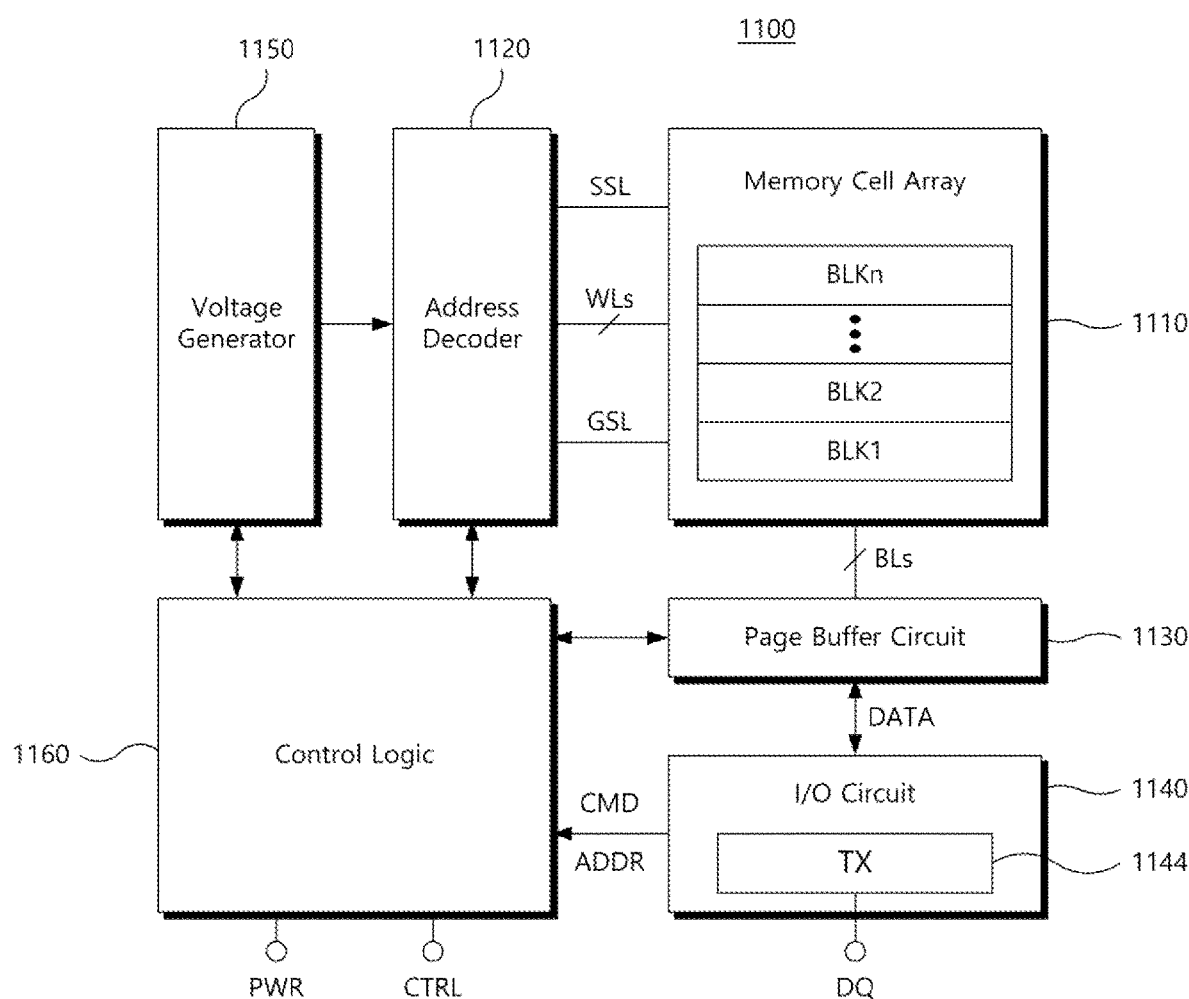
FIG. 2 is a block diagram illustrating a nonvolatile memory device illustrated in FIG. 1.

FIG. 2 is a block diagram illustrating a nonvolatile memory device illustrated in FIG. 1. Referring to FIG. 2, the nonvolatile memory device 1100 may include the memory cell array 1110, an address decoder 1120, a page buffer circuit 1130, an input/output circuit 1140, a voltage generator 1150, and control logic 1160.

According to an example embodiment, the memory cell array 1110 may include a plurality of memory blocks BLK1 to BLKn storing data. For example, each of the memory blocks BLK1 to BLKn may have a two-dimensional structure or a three-dimensional structure. Memory cells of a memory block with the two-dimensional structure (or a horizontal (or planar) structure) may be formed in a direction parallel to a substrate. Memory cells of a memory block with the three-dimensional structure (or a vertical structure) may be formed in a direction perpendicular to the substrate. A gate electrode layer and an insulation layer may be alternately deposited on the substrate. The gate electrode layers of one memory block (e.g., BLK1) may be connected with a string selection line SSL, a plurality of word lines WLs, and a ground selection line GSL.

According to an example embodiment, the address decoder 1120 may be connected with the memory cell array 1110 through the selection lines SSL and GSL and the word lines WLs. The address decoder 1120 may select a word line in the program or read operation. The address decoder 1120 may receive a word line voltage from the voltage generator 1150 to provide the selected word line with a program voltage or a read voltage.

According to an example embodiment, the page buffer circuit 1130 may be connected with the memory cell array 1110 through a plurality of bit lines BLs. The page buffer circuit 1130 may temporarily store data to be programmed in the memory cell array 1110 or data read from the memory cell array 1110. The page buffer circuit 1130 may include a page buffer that is connected with each bit line BL. Each page buffer may include a plurality of latches for the purpose of storing or reading multi-bit data.

According to an example embodiment, the input/output circuit 1140 may be connected with the page buffer circuit 1130 internally and may be connected with the memory controller 1200 (refer to FIG. 1) through the data line DQ externally. During the program operation, the input/output circuit 1140 may receive program data from the memory controller 1200. During the read operation, the input/output circuit 1140 may provide the memory controller 1200 with data read from the memory cell array 1110. The input/output circuit 1140 may include the transmit circuit 1144 that transmits data "DATA" read from the memory cell array 1110 to the data line DQ.

According to an example embodiment, the voltage generator 1150 may be supplied with an internal power from the control logic 1160 and may generate the word line voltage necessary to read or write data. The word line voltage may be provided to a selected word line or an unselected word line through the address decoder 1120. Also, during the program operation, the voltage generator 1150 may generate a program voltage that is provided to the selected word line and a pass voltage that is provided to the unselected word line. Also, during the read operation, the voltage generator 1150 may generate a selection read voltage that is provided to the selected word line and a non-selection read voltage that is provided to the unselected word line.

According to an example embodiment, the control logic 1160 may control the program, read, and erase operations of the nonvolatile memory device 1100 by using a command CMD, an address ADDR, and a control signal CTRL provided from the memory controller 1200. The address ADDR may include a block address (or block selection address) for selecting one memory block, and a row address and a column address for selecting one memory cell of the selected memory block.

Figure 3:
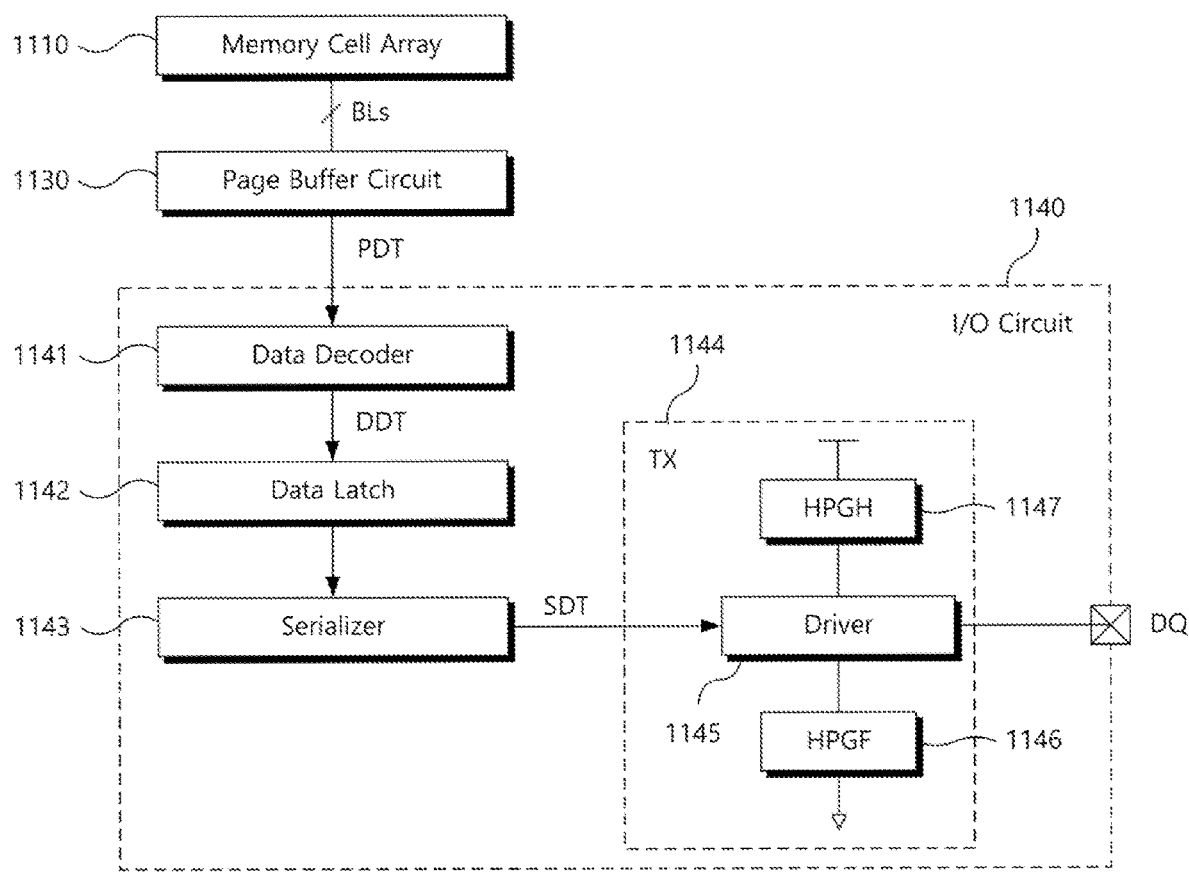
FIG. 3 is a block diagram illustrating an input/output circuit of FIG. 2 in detail.

FIG. 3 is a block diagram illustrating an input/output circuit of FIG. 2 in detail. Referring to FIG. 3, the input/output circuit 1140 may include a data decoder 1141, a data latch 1142, a serializer 1143, and the transmit circuit 1144. The transmit circuit 1144 may include a driver 1145, a first power gating circuit 1146, and a second power gating circuit 1147.

According to an example embodiment, the page buffer circuit 1130 may read data from the memory cell array 1110 through the bit lines BLs. The data read from the memory cell array 1110 may be transferred in the form of parallel data PDT. The page buffer circuit 1130 may provide the parallel data PDT to the data decoder 1141. The data decoder 1141 may multiplex the parallel data PDT so as to be converted into double data DDT. The double data DDT may include a plurality of data obtained by serializing a portion of the parallel data PDT. The data latch 1142 may temporarily store the double data DDT. The serializer 1143 may merge the double data DDT so as to be converted into serial data SDT. The serial data SDT may be provided to the data line DQ through the driver 1145.

According to an example embodiment, the driver 1145 may transmit the serial data SDT to the outside through the data line DQ. For example, the driver 1145 may include a pull-down transistor that is turned on based on a pull-down signal of the serial data SDT and a pull-up transistor that is turned on based on a pull-up signal of the serial data SDT. In the case of increasing operating currents of the pull-down transistor and the pull-up transistor to increase an operating speed, a leakage current may occur in the process of switching operations of the pull-down transistor and the pull-up transistor.

According to an example embodiment, the first power gating circuit 1146 may block the leakage current of the pull-down transistor. The first power gating circuit 1146 may be connected between a source of the pull-down transistor and a ground terminal. The second power gating circuit 1147 may block the leakage current of the pull-up transistor. The second power gating circuit 1147 may be connected between a power terminal and a drain of the pull-up transistor. In general, the first power gating circuit 1146 or the second power gating circuit 1147 may be implemented with one transistor having a threshold voltage of a high level. However, in the case where the first power gating circuit 1146 or the second power gating circuit 1147 is implemented with one transistor having a threshold voltage of a high level, the increase in the area tends to be greater than the improvement in leakage current blocking performance of the first power gating circuit 1146 or the second power gating circuit 1147.

According to an example embodiment, the first power gating circuit 1146 or the second power gating circuit 1147 of the present disclosure may include a plurality of power gating transistors, the threshold voltages of which have different magnitudes. The plurality of power gating transistors may be connected in parallel with the pull-down transistor or the pull-up transistor. The first power gating circuit 1146 or the second power gating circuit 1147 that is implemented with the plurality of power gating transistors, the threshold voltages of which are different in magnitude, may be implemented in the smaller area with the same performance, compared to the case where the first power gating circuit 1146 or the second power gating circuit 1147 is implemented with one power gating transistor having a great threshold voltage. In this case, the greatest threshold voltage of threshold voltages of the plurality of power gating transistors connected in parallel may be greater than the threshold voltage of the one power gating transistor.

Figure 4:
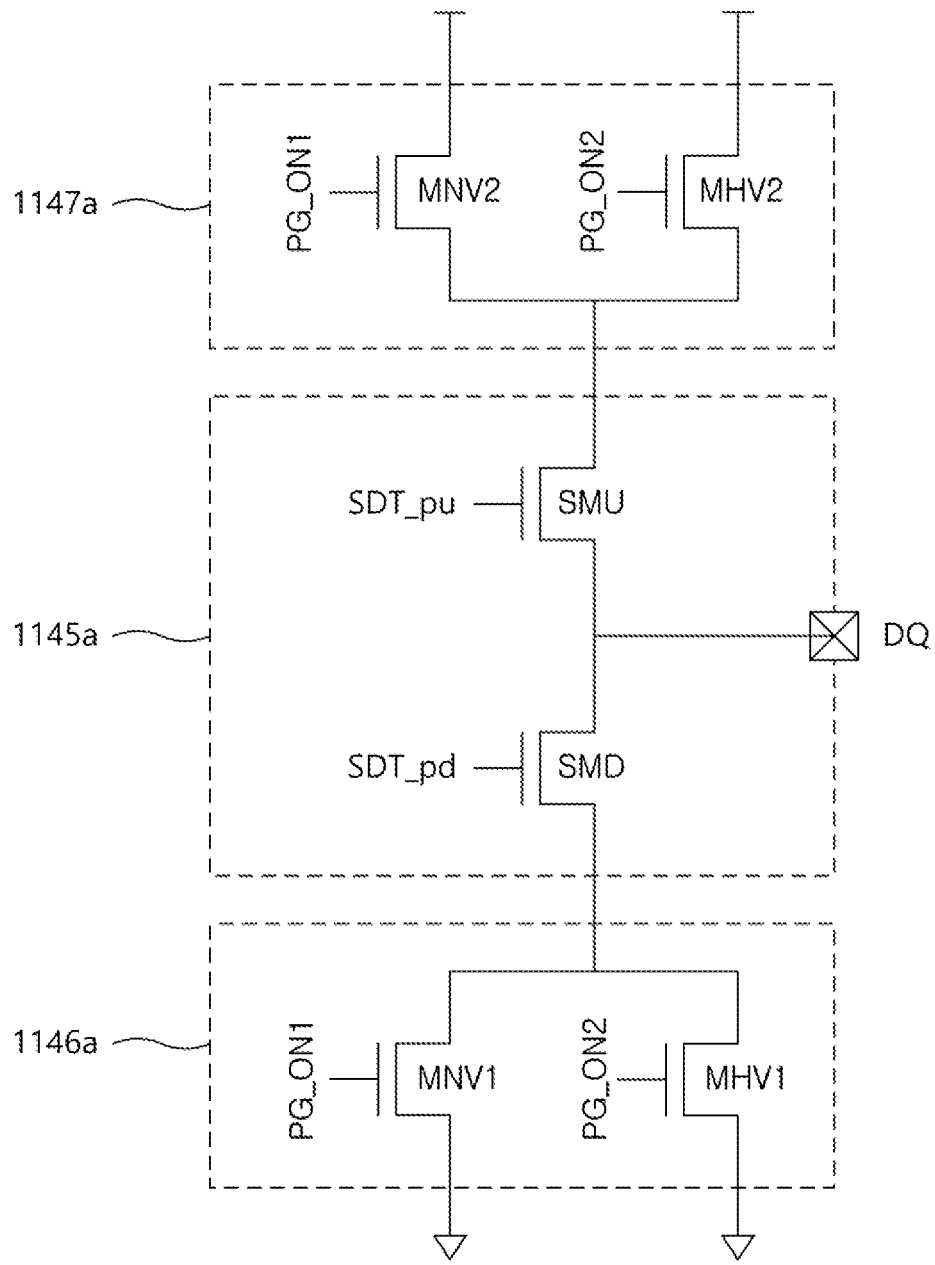
FIG. 4 is a is a diagram illustrating an example of a first power gating circuit or a second power gating circuit of FIG. 3.

FIG. 4 is a diagram illustrating an example of a first power gating circuit or a second power gating circuit of FIG. 3. Referring to FIG. 4, a transmit circuit 1144a may include a driver 1145a, a first power gating circuit 1146a, and a second power gating circuit 1147a. For convenience of description, the transmit circuit 1144a that includes both the first power gating circuit 1146a and the second power gating circuit 1147a is illustrated in FIG. 4; however, the transmit circuit 1144a may include only the first power gating circuit 1146a, may include only the second power gating circuit 1147a, or may include both the first power gating circuit 1146a and the second power gating circuit 1147a.

According to an example embodiment, the driver 1145a may include a pull-down transistor SMD and a pull-up transistor SMU. For example, the pull-down transistor SMD may include a drain connected with the data line DQ and a source connected with the first power gating circuit 1146a. The pull-down transistor SMD may be turned on based on a pull-down signal SDT_pd of the serial data. The pull-up transistor SMU may include a drain connected with the second power gating circuit 1147a and a source connected with the data line DQ. The pull-up transistor SMU may be turned on based on a pull-up signal SDT_pu of the serial data. The pull-down transistor SMD or the pull-up transistor SMU may have a first threshold voltage. As an example, each of the pull-down transistor SMD and the pull-up transistor SMU may be implemented with an NMOS transistor.

According to an example embodiment, the first power gating circuit 1146a may include a plurality of power gating transistors that are electrically connected in parallel. For example, the first power gating circuit 1146a may include a first normal transistor MNV1 and a first high transistor MHV1. A drain of the first normal transistor MNV1 and a drain of the first high transistor MHV1 may be connected with the source of the pull-down transistor SMD. A source of the first normal transistor MNV1 and a source of the first high transistor MHV1 may be connected with the ground terminal. The first normal transistor MNV1 may be turned on based on a first power gating voltage PG_ON1. The first high transistor MHV1 may be turned on based on a second power gating voltage PG_ON2. As an example, each of the first normal transistor MNV1 and the first high transistor MHV1 may be implemented with an NMOS transistor.

For example, the first power gating voltage PG_ON1 may have the same magnitude as the second power gating voltage PG_ON2. Alternatively, the magnitude of the first power gating voltage PG_ON1 may be different from the magnitude of the second power gating voltage PG_ON2. As an example, because the first normal transistor MNV1 has a threshold voltage lower than that of the first high transistor MHV1, the first power gating voltage PG_ON1 may be set to be lower than the second power gating voltage PG_ON2. Meanwhile, the first power gating voltage PG_ON1 and the second power gating voltage PG_ON2 may be applied at the same timing (or time point). Alternatively, the first power gating voltage PG_ON1 and the second power gating voltage PG_ON2 may be applied at different timings (or time points). As an example, the first power gating voltage PG_ON1 that is applied to the first normal transistor MNV1, the threshold voltage of which is lower than that of the first high transistor MHV1, may be applied prior to the second power gating voltage PG_ON2.

According to an example embodiment, threshold voltages of the plurality of power gating transistors included in the first power gating circuit 1146a may be different in magnitude. For example, the first normal transistor MNV1 may have a second threshold voltage greater than the first threshold voltage. The first high transistor MHV1 may have a third threshold voltage greater than the second threshold voltage. However, a threshold voltage of one power gating transistor, the leakage current blocking performance of which is the same as the leakage current blocking performance implemented by the parallel connection of the first normal transistor MNV1 and the first high transistor MHV1, may be greater in magnitude than the third threshold voltage. Also, one power gating transistor, the leakage current blocking performance of which is the same as the leakage current blocking performance implemented by the parallel connection of the first normal transistor MNV1 and the first high transistor MHV1, may occupy the area that is larger than a sum of the area of the first normal transistor MNV1 and the area of the first high transistor MHV1.

According to an example embodiment, the second power gating circuit 1147a may include a plurality of power gating transistors that are electrically connected in parallel. For example, the second power gating circuit 1147a may include a second normal transistor MNV2 and a second high transistor MHV2. A drain of the second normal transistor MNV2 and a drain of the second high transistor MHV2 may be connected with the power terminal. A source of the second normal transistor MNV2 and a source of the second high transistor MHV2 may be connected with the drain of the pull-up transistor SMU. The second normal transistor MNV2 may be turned on based on the first power gating voltage PG_ON1. The second high transistor MHV2 may be turned on based on the second power gating voltage PG_ON2. As an example, each of the second normal transistor MNV2 and the second high transistor MHV2 may be implemented with an NMOS transistor.

According to an example embodiment, threshold voltages of the plurality of power gating transistors included in the second power gating circuit 1147a may be different in magnitude. For example, the second normal transistor MNV2 may have the second threshold voltage greater than the first threshold voltage. The second high transistor MHV2 may have the third threshold voltage greater than the second threshold voltage. However, a threshold voltage of one power gating transistor, the leakage current blocking performance of which is the same as the leakage current blocking performance implemented by the parallel connection of the second normal transistor MNV2 and the second high transistor MHV2, may be greater in magnitude than the third threshold voltage. Also, one power gating transistor, the leakage current blocking performance of which is the same as the leakage current blocking performance implemented by the parallel connection of the second normal transistor MNV2 and the second high transistor MHV2, may occupy the area that is larger than a sum of the area of the second normal transistor MNV2 and the area of the second high transistor MHV2.

Figure 5:
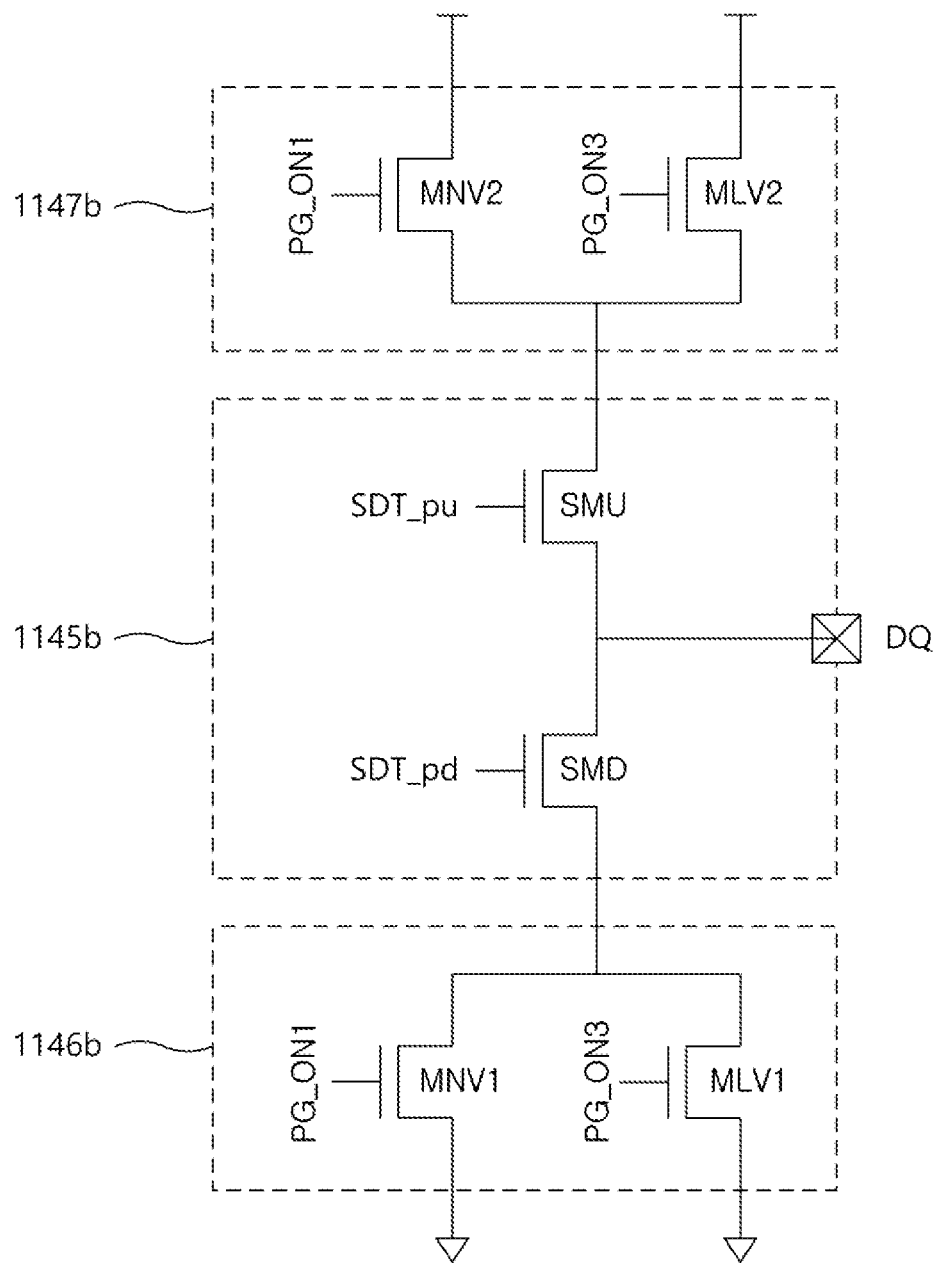
FIG. 5 is a is a diagram illustrating another example of a first power gating circuit or a second power gating circuit of FIG. 3.

FIG. 5 is a diagram illustrating another example of a first power gating circuit or a second power gating circuit of FIG. 3. Referring to FIG. 5, a transmit circuit 1144b may include a driver 1145b, a first power gating circuit 1146b, and a second power gating circuit 1147b. For convenience of description, the transmit circuit 1144b that includes both the first power gating circuit 1146b and the second power gating circuit 1147b is illustrated in FIG. 5; however, the transmit circuit 1144b may include only the first power gating circuit 1146b, may include only the second power gating circuit 1147b, or may include both the first power gating circuit 1146b and the second power gating circuit 1147b.

According to an example embodiment, the driver 1145b may include the pull-down transistor SMD and the pull-up transistor SMU. Threshold voltage characteristics and operating characteristics of the pull-down transistor SMD and the pull-up transistor SMU are identical to those of the pull-down transistor SMD and the pull-up transistor SMU of FIG. 4, and thus, additional description will be omitted to avoid redundancy.

According to an example embodiment, the first power gating circuit 1146b may include a plurality of power gating transistors that are electrically connected in parallel. For example, the first power gating circuit 1146b may include a first normal transistor MNV1 and a first low transistor MLV1. A drain of the first normal transistor MNV1 and a drain of the first low transistor MLV1 may be connected with the source of the pull-down transistor SMD. A source of the first normal transistor MNV1 and a source of the first low transistor MLV1 may be connected with the ground terminal. The first normal transistor MNV1 may be turned on based on the first power gating voltage PG_ON1. The first low transistor MLV1 may be turned on based on a third power gating voltage PG_ON3. As an example, each of the first normal transistor MNV1 and the first low transistor MLV1 may be implemented with an NMOS transistor.

For example, the first power gating voltage PG_ON1 may have the same magnitude as the third power gating voltage PG_ON3. Alternatively, the magnitude of the first power gating voltage PG_ON1 may be different from the magnitude of the third power gating voltage PG_ON3. As an example, because the first low transistor MLV1 has a threshold voltage lower than that of the first normal transistor MNV1, the third power gating voltage PG_ON3 may be set to be lower than the first power gating voltage PG_ON1. Meanwhile, the first power gating voltage PG_ON1 and the third power gating voltage PG_ON3 may be applied at the same timing (or time point). Alternatively, the first power gating voltage PG_ON1 and the third power gating voltage PG_ON3 may be applied at different timings (or time points). As an example, the third power gating voltage PG_ON3 that is applied to the first low transistor MLV1, the threshold voltage of which is lower than that of the first normal transistor MNV1, may be applied prior to the first power gating voltage PG_ON1.

According to an example embodiment, threshold voltages of the plurality of power gating transistors included in the first power gating circuit 1146b may be different in magnitude. For example, the first normal transistor MNV1 may have the second threshold voltage greater than the first threshold voltage. The first low transistor MLV1 may have a fourth threshold voltage smaller than the second threshold voltage. As an example, the fourth threshold voltage may be smaller than the first threshold voltage. However, a threshold voltage of one power gating transistor, the leakage current blocking performance of which is the same as the leakage current blocking performance implemented by the parallel connection of the first normal transistor MNV1 and the first low transistor MLV1, may be greater in magnitude than the second threshold voltage. Also, one power gating transistor, the leakage current blocking performance of which is the same as the leakage current blocking performance implemented by the parallel connection of the first normal transistor MNV1 and the first low transistor MLV1, may occupy the area that is larger than a sum of the area of the first normal transistor MNV1 and the area of the first low transistor MLV1.

According to an example embodiment, the second power gating circuit 1147b may include a plurality of power gating transistors that are electrically connected in parallel. For example, the second power gating circuit 1147b may include a second normal transistor MNV2 and a second low transistor MLV2. A drain of the second normal transistor MNV2 and a drain of the second low transistor MLV2 may be connected with the power terminal. A source of the second normal transistor MNV2 and a source of the second low transistor MLV2 may be connected with the drain of the pull-up transistor SMU. The second normal transistor MNV2 may be turned on based on the first power gating voltage PG_ON1. The second low transistor MLV2 may be turned on based on the third power gating voltage PG_ON3. As an example, each of the second normal transistor MNV2 and the second low transistor MLV2 may be implemented with an NMOS transistor.

According to an example embodiment, threshold voltages of the plurality of power gating transistors included in the second power gating circuit 1147b may be different in magnitude. For example, the second normal transistor MNV2 may have the second threshold voltage greater than the first threshold voltage. The second low transistor MLV2 may have the fourth threshold voltage smaller than the second threshold voltage. As an example, the fourth threshold voltage may be smaller than the first threshold voltage. However, a threshold voltage of one power gating transistor, the leakage current blocking performance of which is the same as the leakage current blocking performance implemented by the parallel connection of the second normal transistor MNV2 and the second low transistor MLV2, may be greater in magnitude than the second threshold voltage. Also, one power gating transistor, the leakage current blocking performance of which is the same as the leakage current blocking performance implemented by the parallel connection of the second normal transistor MNV2 and the second low transistor MLV2, may occupy the area that is larger than a sum of the area of the second normal transistor MNV2 and the area of the second low transistor MLV2.

Figure 6:
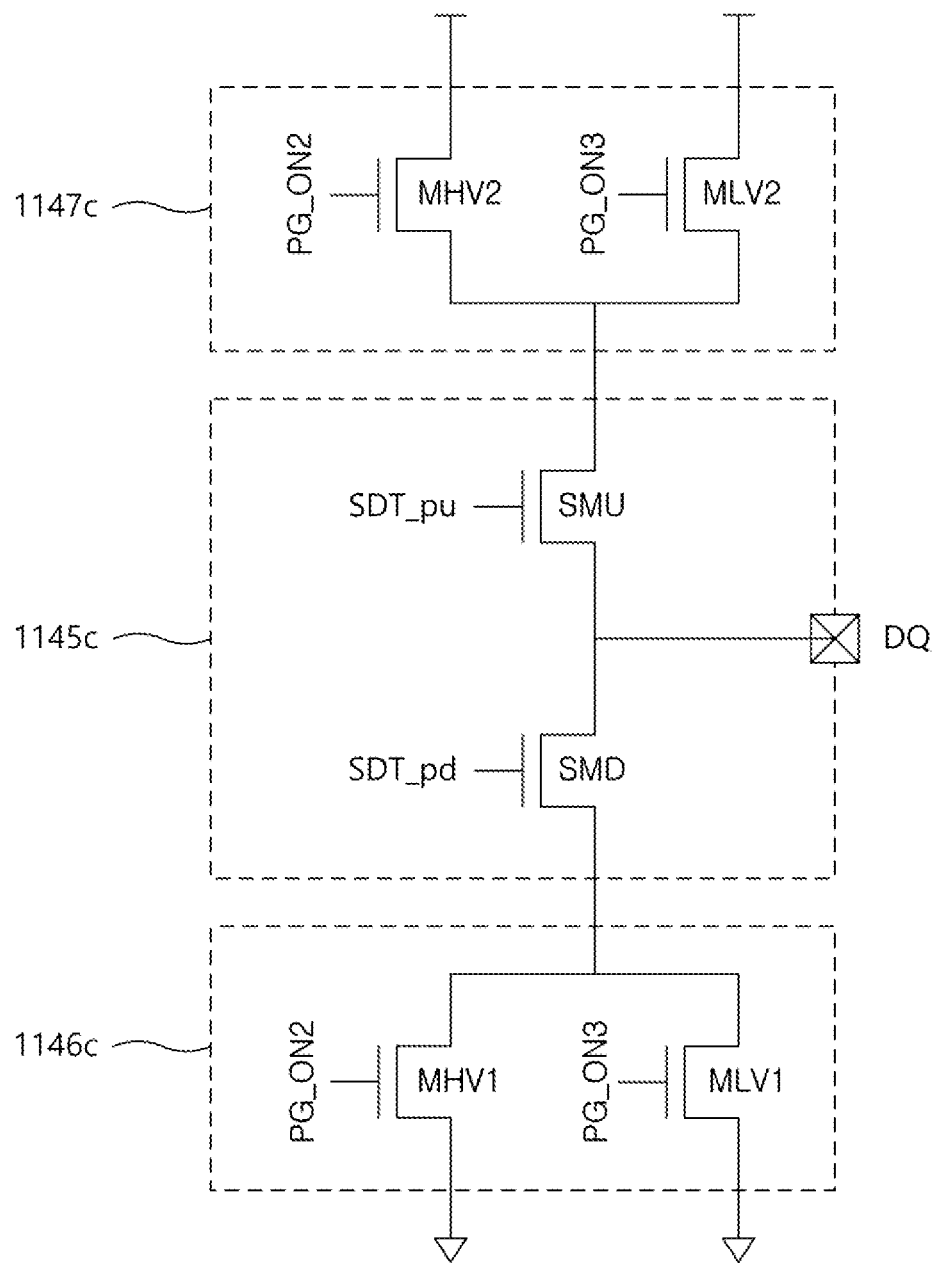
FIG. 6 is a diagram illustrating another example of a first power gating circuit or a second power gating circuit of FIG. 3.

FIG. 6 is a diagram illustrating another example of a first power gating circuit or a second power gating circuit of FIG. 3. Referring to FIG. 6, a transmit circuit 1144c may include a driver 1145c, a first power gating circuit 1146c, and a second power gating circuit 1147c. For convenience of description, the transmit circuit 1144c that includes both the first power gating circuit 1146c and the second power gating circuit 1147c is illustrated in FIG. 6; however, the transmit circuit 1144c may include only the first power gating circuit 1146c, may include only the second power gating circuit 1147c, or may include both the first power gating circuit 1146c and the second power gating circuit 1147c.

According to an example embodiment, the driver 1145c may include the pull-down transistor SMD and the pull-up transistor SMU. Threshold voltage characteristics and operating characteristics of the pull-down transistor SMD and the pull-up transistor SMU are identical to those of the pull-down transistor SMD and the pull-up transistor SMU of FIG. 4, and thus, additional description will be omitted to avoid redundancy.

According to an example embodiment, the first power gating circuit 1146c may include a plurality of power gating transistors that are electrically connected in parallel. For example, the first power gating circuit 1146c may include a first high transistor MHV1 and a first low transistor MLV1. A drain of the first high transistor MHV1 and a drain of the first low transistor MLV1 may be connected with the source of the pull-down transistor SMD. A source of the first high transistor MHV1 and a source of the first low transistor MLV1 may be connected with the ground terminal. The first high transistor MHV1 may be turned on based on the second power gating voltage PG_ON2. The first low transistor MLV1 may be turned on based on the third power gating voltage PG_ON3. As an example, each of the first high transistor MHV1 and the first low transistor MLV1 may be implemented with an NMOS transistor.

For example, the second power gating voltage PG_ON2 may have the same magnitude as the third power gating voltage PG_ON3. Alternatively, the magnitude of the second power gating voltage PG_ON2 may be different from the magnitude of the third power gating voltage PG_ON3. As an example, because the first low transistor MLV1 has a threshold voltage lower than that of the first high transistor MHV1, the third power gating voltage PG_ON3 may be set to be lower than the second power gating voltage PG_ON2. Meanwhile, the second power gating voltage PG_ON2 and the third power gating voltage PG_ON3 may be applied at the same timing (or time point). Alternatively, the second power gating voltage PG_ON2 and the third power gating voltage PG_ON3 may be applied at different timings (or time points). As an example, the third power gating voltage PG_ON3 that is applied to the first low transistor MLV1, the threshold voltage of which is lower than that of the first high transistor MHV1, may be applied prior to the second power gating voltage PG_ON2.

According to an example embodiment, threshold voltages of the plurality of power gating transistors included in the first power gating circuit 1146c may be different in magnitude. For example, the first high transistor MHV1 may have the third threshold voltage greater than the second threshold voltage of the first normal transistor MNV1 of FIG. 4. The first low transistor MLV1 may have the fourth threshold voltage smaller than the second threshold voltage. As an example, the fourth threshold voltage may be smaller than the first threshold voltage. However, a threshold voltage of one power gating transistor, the leakage current blocking performance of which is the same as the leakage current blocking performance implemented by the parallel connection of the first high transistor MHV1 and the first low transistor MLV1, may be greater in magnitude than the third threshold voltage. Also, one power gating transistor, the leakage current blocking performance of which is the same as the leakage current blocking performance implemented by the parallel connection of the first high transistor MHV1 and the first low transistor MLV1, may occupy the area that is larger than a sum of the area of the first high transistor MHV1 and the area of the first low transistor MLV1.

According to an example embodiment, the second power gating circuit 1147c may include a plurality of power gating transistors that are electrically connected in parallel. For example, the second power gating circuit 1147c may include a second high transistor MHV2 and a second low transistor MLV2. A drain of the second high transistor MHV2 and a drain of the second low transistor MLV2 may be connected with the power terminal. A source of the second high transistor MHV2 and a source of the second low transistor MLV2 may be connected with the drain of the pull-up transistor SMU. The second high transistor MHV2 may be turned on based on the second power gating voltage PG_ON2. The second low transistor MLV2 may be turned on based on the third power gating voltage PG_ON3. As an example, each of the second high transistor MHV2 and the second low transistor MLV2 may be implemented with an NMOS transistor.

According to an example embodiment, threshold voltages of the plurality of power gating transistors included in the second power gating circuit 1147c may be different in magnitude. For example, the second high transistor MHV2 may have the third threshold voltage greater than the second threshold voltage of the second normal transistor MNV2 of FIG. 4. The second low transistor MLV2 may have the fourth threshold voltage smaller than the second threshold voltage. As an example, the fourth threshold voltage may be smaller than the first threshold voltage. However, a threshold voltage of one power gating transistor, the leakage current blocking performance of which is the same as the leakage current blocking performance implemented by the parallel connection of the second high transistor MHV2 and the second low transistor MLV2, may be greater in magnitude than the third threshold voltage. Also, one power gating transistor, the leakage current blocking performance of which is the same as the leakage current blocking performance implemented by the parallel connection of the second high transistor MHV2 and the second low transistor MLV2, may occupy the area that is larger than a sum of the area of the second high transistor MHV2 and the area of the second low transistor MLV2.

Figure 7:
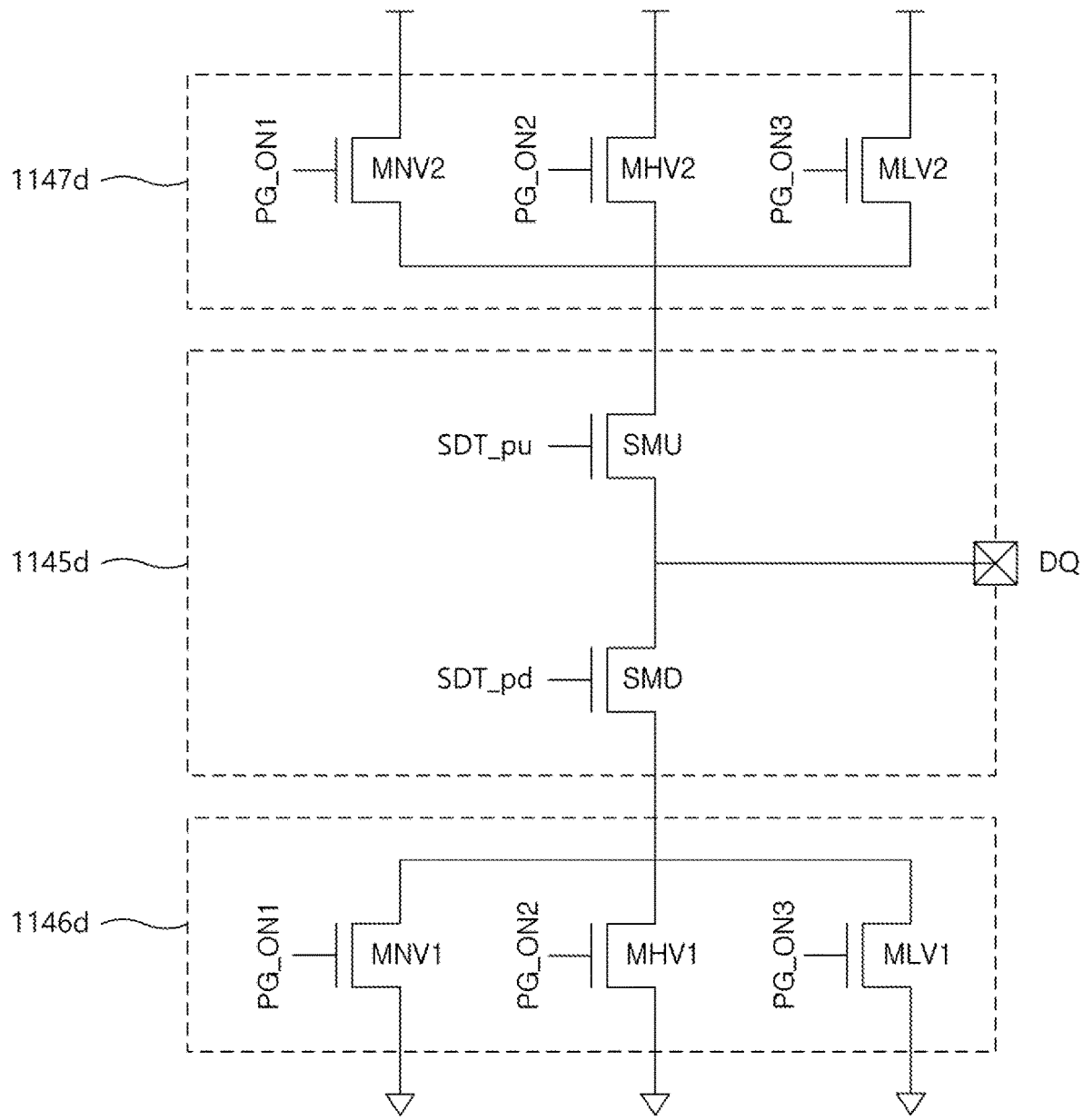
FIG. 7 is a diagram illustrating another example of a first power gating circuit or a second power gating circuit of FIG. 3.

FIG. 7 is a diagram illustrating another example of a first power gating circuit or a second power gating circuit of FIG. 3. Referring to FIG. 7, a transmit circuit 1144d may include a driver 1145d, a first power gating circuit 1146d, and a second power gating circuit 1147d. For convenience of description, the transmit circuit 1144d that includes both the first power gating circuit 1146d and the second power gating circuit 1147d is illustrated in FIG. 7; however, the transmit circuit 1144d may include only the first power gating circuit 1146d, may include only the second power gating circuit 1147d, or may include both the first power gating circuit 1146d and the second power gating circuit 1147d.

According to an example embodiment, the driver 1145d may include the pull-down transistor SMD and the pull-up transistor SMU. Threshold voltage characteristics and operating characteristics of the pull-down transistor SMD and the pull-up transistor SMU are identical to those of the pull-down transistor SMD and the pull-up transistor SMU of FIG. 4, and thus, additional description will be omitted to avoid redundancy.

According to an example embodiment, the first power gating circuit 1146d may include a plurality of power gating transistors that are electrically connected in parallel. For example, the first power gating circuit 1146d may include a first normal transistor MNV1, a first high transistor MHV1, and a first low transistor MLV1. A drain of the first normal transistor MNV1, a drain of the first high transistor MHV1, and a drain of the first low transistor MLV1 may be connected with the source of the pull-down transistor SMD. A source of the first normal transistor MNV1, a source of the first high transistor MHV1, and a source of the first low transistor MLV1 may be connected with the ground terminal. The first normal transistor MNV1 may be turned on based on the first power gating voltage PG_ON1. The first high transistor MHV1 may be turned on based on the second power gating voltage PG_ON2. The first low transistor MLV1 may be turned on based on the third power gating voltage PG_ON3. As an example, each of the first normal transistor MNV1, the first high transistor MHV1, and the first low transistor MLV1 may be implemented with an NMOS transistor.

For example, the first power gating voltage PG_ON1, the second power gating voltage PG_ON2, and the third power gating voltage PG_ON3 may have the same magnitude. Alternatively, the first power gating voltage PG_ON1, the second power gating voltage PG_ON2, and the third power gating voltage PG_ON3 may be different in magnitude. As an example, because the first normal transistor MNV1 has a threshold voltage lower than that of the first high transistor MHV1, the first power gating voltage PG_ON1 may be set to be lower than the second power gating voltage PG_ON2. Because the first low transistor MLV1 has a threshold voltage lower than that of the first normal transistor MNV1, the third power gating voltage PG_ON3 may be set to be lower than the first power gating voltage PG_ON1. Meanwhile, the first power gating voltage PG_ON1, the second power gating voltage PG_ON2, and the third power gating voltage PG_ON3 may be applied at the same timing. Alternatively, the first power gating voltage PG_ON1, the second power gating voltage PG_ON2, and the third power gating voltage PG_ON3 may be applied in different timings. As an example, the first power gating voltage PG_ON1 that is applied to the first normal transistor MNV1, the threshold voltage of which is lower than that of the first high transistor MHV1, may be applied prior to the second power gating voltage PG_ON2. The third power gating voltage PG_ON3 that is applied to the first low transistor MLV1, the threshold voltage of which is lower than that of the first normal transistor MNV1, may be applied prior to the first power gating voltage PG_ON1.

According to an example embodiment, threshold voltages of the plurality of power gating transistors included in the first power gating circuit 1146d may be different in magnitude. For example, the first normal transistor MNV1 may have the second threshold voltage greater than the first threshold voltage. The first high transistor MHV1 may have the third threshold voltage greater than the second threshold voltage. The first low transistor MLV1 may have the fourth threshold voltage smaller than the second threshold voltage. As an example, the fourth threshold voltage may be smaller than the first threshold voltage. However, a threshold voltage of one power gating transistor, the leakage current blocking performance of which is the same as the leakage current blocking performance implemented by the parallel connection of the first normal transistor MNV1, the first high transistor MHV1, and the first low transistor MLV1, may be greater in magnitude than the third threshold voltage. Also one power gating transistor, the leakage current blocking performance of which is the same as the leakage current blocking performance implemented by the parallel connection of the first normal transistor MNV1, the first high transistor MHV1, and the first low transistor MLV1, may occupy the area that is larger than a sum of the area of the first normal transistor MNV1, the area of the first high transistor MHV1, and the area of the first low transistor MLV1.

According to an example embodiment, the second power gating circuit 1147d may include a plurality of power gating transistors that are electrically connected in parallel. For example, the second power gating circuit 1147d may include a second normal transistor MNV2, a second high transistor MHV2, and a second low transistor MLV2. A drain of the second normal transistor MNV2, a drain of the second high transistor MHV2, and a drain of the second low transistor MLV2 may be connected with the power terminal. A source of the second normal transistor MNV2, a source of the second high transistor MHV2, and a source of the second low transistor MLV2 may be connected with the drain of the pull-up transistor SMU. The second normal transistor MNV2 may be turned on based on the first power gating voltage PG_ON1. The second high transistor MHV2 may be turned on based on the second power gating voltage PG_ON2. The second low transistor MLV2 may be turned on based on the third power gating voltage PG_ON3. As an example, each of the second normal transistor MNV2, the second high transistor MHV2, and the second low transistor MLV2 may be implemented with an NMOS transistor.

According to an example embodiment, threshold voltages of the plurality of power gating transistors included in the second power gating circuit 1147d may be different in magnitude. For example, the second normal transistor MNV2 may have the second threshold voltage greater than the first threshold voltage. The second high transistor MHV2 may have the third threshold voltage greater than the second threshold voltage. The second low transistor MLV2 may have the fourth threshold voltage smaller than the second threshold voltage. As an example, the fourth threshold voltage may be smaller than the first threshold voltage. However, a threshold voltage of one power gating transistor, the leakage current blocking performance of which is the same as the leakage current blocking performance implemented by the parallel connection of the second normal transistor MNV2, the second high transistor MHV2, and the second low transistor MLV2, may be greater in magnitude than the third threshold voltage. Also one power gating transistor, the leakage current blocking performance of which is the same as the leakage current blocking performance implemented by the parallel connection of the second normal transistor MNV2, the second high transistor MHV2, and the second low transistor MLV2, may occupy the area that is larger than a sum of the area of the second normal transistor MNV2, the area of the second high transistor MHV2, and the area of the second low transistor MLV2.

Figure 8:
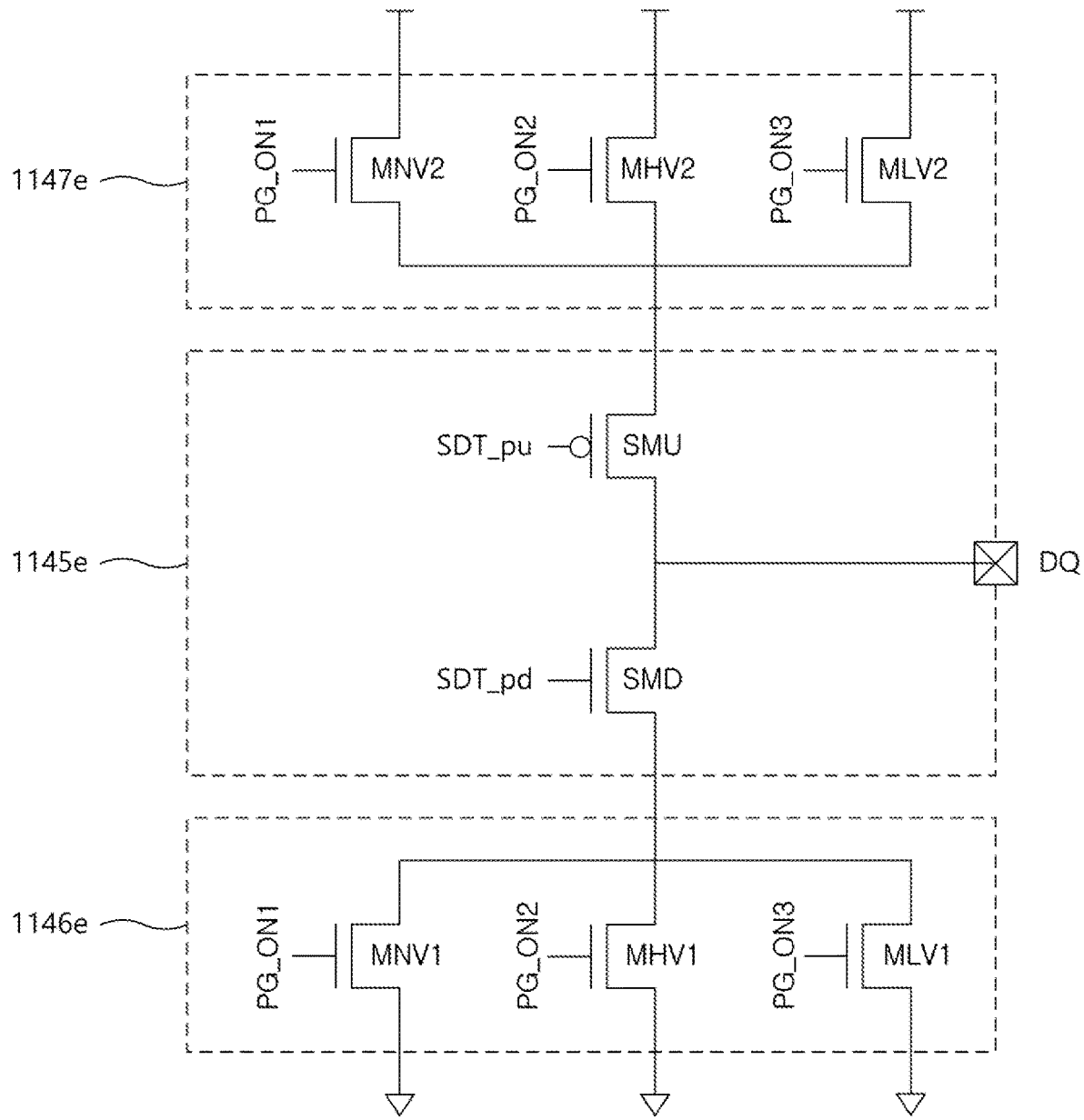
FIG. 8 is a diagram illustrating another example of a first power gating circuit or a second power gating circuit of FIG. 3.

FIG. 8 is a diagram illustrating another example of a first power gating circuit or a second power gating circuit of FIG. 3. Referring to FIG. 8, a transmit circuit 1144e may include a driver 1145e, a first power gating circuit 1146e, and a second power gating circuit 1147e. For convenience of description, the transmit circuit 1144e that includes both the first power gating circuit 1146e and the second power gating circuit 1147e is illustrated in FIG. 8; however, the transmit circuit 1144e may include only the first power gating circuit 1146e, may include only the second power gating circuit 1147e, or may include both the first power gating circuit 1146e and the second power gating circuit 1147e.

According to an embodiment, the driver 1145e may include the pull-down transistor SMD and the pull-up transistor SMU. For example, the pull-down transistor SMD may be connected between the data line DQ and the first power gating circuit 1146e. Alternatively, in the case where the first power gating circuit 1146e is not provided, the pull-down transistor SMD may be connected between the data line DQ and the ground terminal. The pull-down transistor SMD may be implemented with an NMOS transistor. The pull-down transistor SMD may be turned on based on the pull-down signal SDT_pd of the serial data. The pull-up transistor SMU may be connected between the second power gating circuit 1147e and the data line DQ. The pull-up transistor SMU may be implemented with a positive metal-oxide semiconductor (PMOS) transistor. The pull-up transistor SMU may be turned on based on the pull-up signal SDT_pu of the serial data. The pull-down transistor SMD or the pull-up transistor SMU may have the first threshold voltage.

According to an example embodiment, the first power gating circuit 1146e may include a plurality of power gating transistors that are electrically connected in parallel. For example, the first power gating circuit 1146e may include at least two of a first normal transistor MNV1, a first high transistor MHV1, and a first low transistor MLV1. Each of the first normal transistor MNV1, the first high transistor MHV1, and the first low transistor MLV1 may be connected between the pull-down transistor SMD and the ground terminal. The first normal transistor MNV1 may be turned on based on the first power gating voltage PG_ON1. The first high transistor MHV1 may be turned on based on the second power gating voltage PG_ON2. The first low transistor MLV1 may be turned on based on the third power gating voltage PG_ON3. As an example, each of the first normal transistor MNV1, the first high transistor MHV1, and the first low transistor MLV1 may be implemented with an negative metal-oxide semiconductor (NMOS) transistor.

According to an example embodiment, threshold voltage characteristics and operating characteristics of the first normal transistor MNV1, the first high transistor MHV1, and the first low transistor MLV1 are identical to those of the first normal transistor MNV1, the first high transistor MHV1, and the first low transistor MLV1 of FIG. 7, and thus, additional description will be omitted to avoid redundancy.

According to an example embodiment, the second power gating circuit 1147e may include a plurality of power gating transistors that are electrically connected in parallel. For example, the second power gating circuit 1147e may include at least two of a second normal transistor MNV2, a second high transistor MHV2, and a second low transistor MLV2. Each of the second normal transistor MNV2, the second high transistor MHV2, and the second low transistor MLV2 may be connected between the power terminal and the pull-up transistor SMU. The second normal transistor MNV2 may be turned on based on the first power gating voltage PG_ON1. The second high transistor MHV2 may be turned on based on the second power gating voltage PG_ON2. The second low transistor MLV2 may be turned on based on the third power gating voltage PG_ON3. As an example, each of the second normal transistor MNV2, the second high transistor MHV2, and the second low transistor MLV2 may be implemented with an NMOS transistor.

According to an example embodiment, threshold voltage characteristics and operating characteristics of the second normal transistor MNV2, the second high transistor MHV2, and the second low transistor MLV2 are identical to those of the second normal transistor MNV2, the second high transistor MHV2, and the second low transistor MLV2 of FIG. 7, and thus, additional description will be omitted to avoid redundancy.

Figure 9:
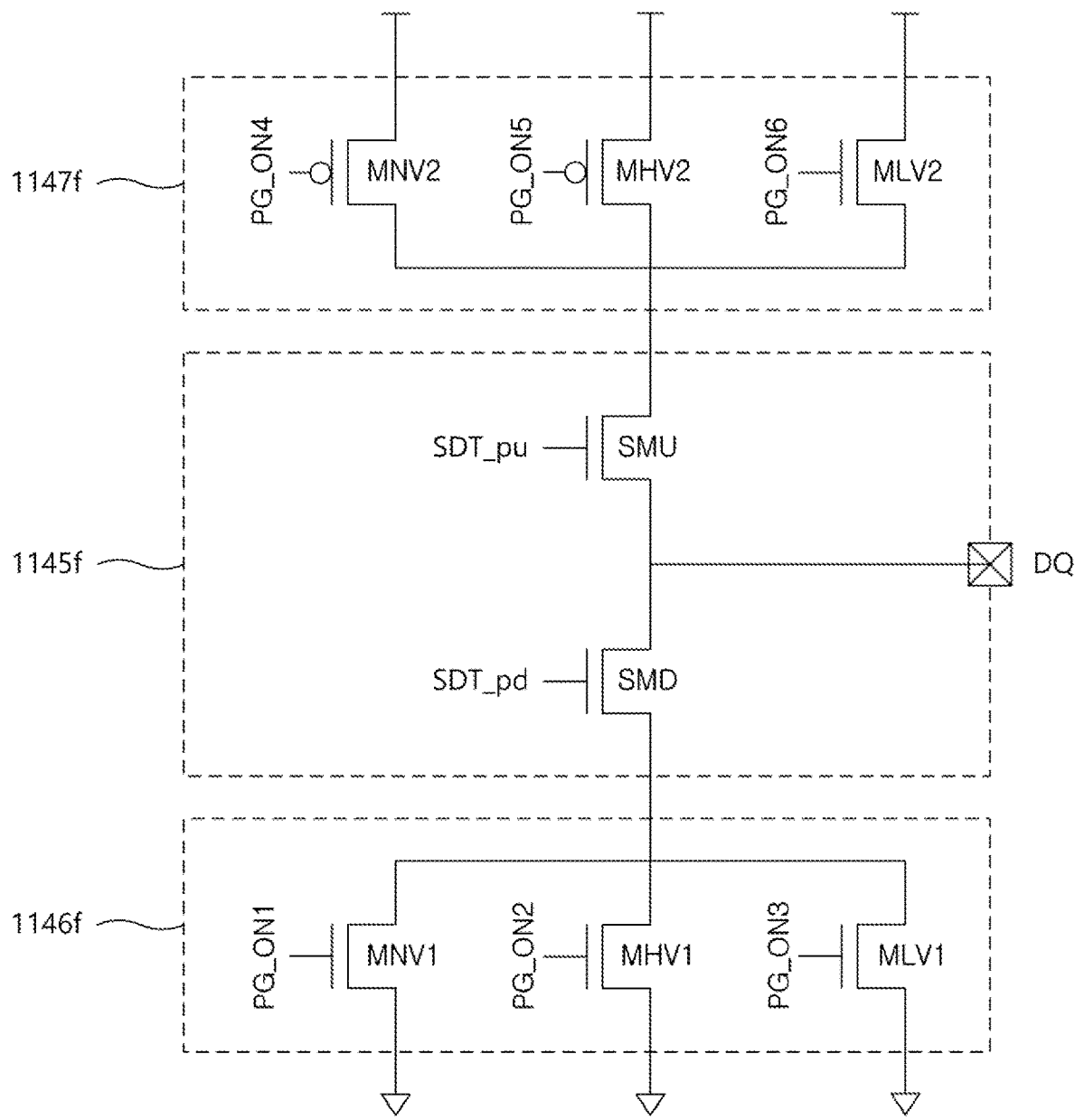
FIG. 9 is a diagram illustrating another example of a first power gating circuit or a second power gating circuit of FIG. 3.

FIG. 9 is a diagram illustrating another example of a first power gating circuit or a second power gating circuit of FIG. 3. Referring to FIG. 9, a transmit circuit 1144f may include a driver 1145f, a first power gating circuit 1146f, and a second power gating circuit 1147f. For convenience of description, the transmit circuit 1144f that includes both the first power gating circuit 1146f and the second power gating circuit 1147f is illustrated in FIG. 9; however, the transmit circuit 1144f may include only the first power gating circuit 1146f, may include only the second power gating circuit 1147f, or may include both the first power gating circuit 1146f and the second power gating circuit 1147f.

According to an example embodiment, the driver 1145f may include the pull-down transistor SMD and the pull-up transistor SMU. Threshold voltage characteristics and operating characteristics of the pull-down transistor SMD and the pull-up transistor SMU are identical to those of the pull-down transistor SMD and the pull-up transistor SMU of FIG. 4, and thus, additional description will be omitted to avoid redundancy.

According to an example embodiment, the first power gating circuit 1146f may include a plurality of power gating transistors that are electrically connected in parallel. For example, the first power gating circuit 1146f may include at least two of a first normal transistor MNV1, a first high transistor MHV1, and a first low transistor MLV1. Each of the first normal transistor MNV1, the first high transistor MHV1, and the first low transistor MLV1 may be connected between the pull-down transistor SMD and the ground terminal. The first normal transistor MNV1 may be turned on based on the first power gating voltage PG_ON1. The first high transistor MHV1 may be turned on based on the second power gating voltage PG_ON2. The first low transistor MLV1 may be turned on based on the third power gating voltage PG_ON3. As an example, each of the first normal transistor MNV1, the first high transistor MHV1, and the first low transistor MLV1 may be implemented with an NMOS transistor.

According to an example embodiment, threshold voltage characteristics and operating characteristics of the first normal transistor MNV1, the first high transistor MHV1, and the first low transistor MLV1 are identical to those of the first normal transistor MNV1, the first high transistor MHV1, and the first low transistor MLV1 of FIG. 7, and thus, additional description will be omitted to avoid redundancy.

According to an example embodiment, the second power gating circuit 1147f may include a plurality of power gating transistors that are electrically connected in parallel. For example, the second power gating circuit 1147f may include at least two of a second normal transistor MNV2, a second high transistor MHV2, and a second low transistor MLV2. Each of the second normal transistor MNV2, the second high transistor MHV2, and the second low transistor MLV2 may be connected between the power terminal and the pull-up transistor SMU. The second normal transistor MNV2 may be turned on based on a fourth power gating voltage PG_ON4. The second high transistor MHV2 may be turned on based on a fifth power gating voltage PG_ON5. The second low transistor MLV2 may be turned on based on a sixth power gating voltage PG_ON6. As an example, each of the second normal transistor MNV2 and the second high transistor MHV2 may be implemented with a PMOS transistor. The second low transistor MLV2 may be implemented with an NMOS transistor.

For example, the fourth power gating voltage PG_ON4, the fifth power gating voltage PG_ON5, and the sixth power gating voltage PG_ON6 may have the same magnitude. Alternatively, the fourth power gating voltage PG_ON4, the fifth power gating voltage PG_ON5, and the sixth power gating voltage PG_ON6 may be different in magnitude. As an example, because the second normal transistor MNV2 has a threshold voltage lower than that of the second high transistor MHV2, the fourth power gating voltage PG_ON4 may be set to be lower than the fifth power gating voltage PG_ON5. Because the second low transistor MLV2 has a threshold voltage lower than that of the second normal transistor MNV2, the sixth power gating voltage PG_ON6 may be set to be lower than the fourth power gating voltage PG_ON4. Meanwhile, the fourth power gating voltage PG_ON4, the fifth power gating voltage PG_ON5, and the sixth power gating voltage PG_ON6 may be applied at the same timing. Alternatively, the fourth power gating voltage PG_ON4, the fifth power gating voltage PG_ON5, and the sixth power gating voltage PG_ON6 may be applied in different timings. As an example, the fourth power gating voltage PG_ON4 that is applied to the second normal transistor MNV2, the threshold voltage of which is lower than that of the second high transistor MHV2, may be applied prior to the fifth power gating voltage PG_ON5. The sixth power gating voltage PG_ON6 that is applied to the second low transistor MLV2, the threshold voltage of which is lower than that of the second normal transistor MNV2, may be applied prior to the fourth power gating voltage PG_ON4.

According to an example embodiment, the phase of the fourth power gating voltage PG_ON4 may be opposite to the phase of the first power gating voltage PG_ON1. The phase of the fifth power gating voltage PG_ON5 may be opposite to the phase of the second power gating voltage PG_ON2. The phase of the sixth power gating voltage PG_ON6 may be to the same as the phase of the third power gating voltage PG_ON3.

According to an example embodiment, threshold voltages of the plurality of power gating transistors included in the second power gating circuit 1147f may be different in magnitude. For example, the second normal transistor MNV2 may have the second threshold voltage greater than the first threshold voltage. The second high transistor MHV2 may have the third threshold voltage greater than the second threshold voltage. The second low transistor MLV2 may have the fourth threshold voltage that is smaller than the second threshold voltage. However, a threshold voltage of one power gating transistor, the leakage current blocking performance of which is the same as the leakage current blocking performance implemented by the parallel connection of the second normal transistor MNV2, the second high transistor MHV2, and the second low transistor MLV2, may be greater in magnitude than the third threshold voltage. Also one power gating transistor, the leakage current blocking performance of which is the same as the leakage current blocking performance implemented by the parallel connection of the second normal transistor MNV2, the second high transistor MHV2, and the second low transistor MLV2, may occupy the area that is larger than a sum of the area of the second normal transistor MNV2, the area of the second high transistor MHV2, and the area of the second low transistor MLV2.

Figure 10:
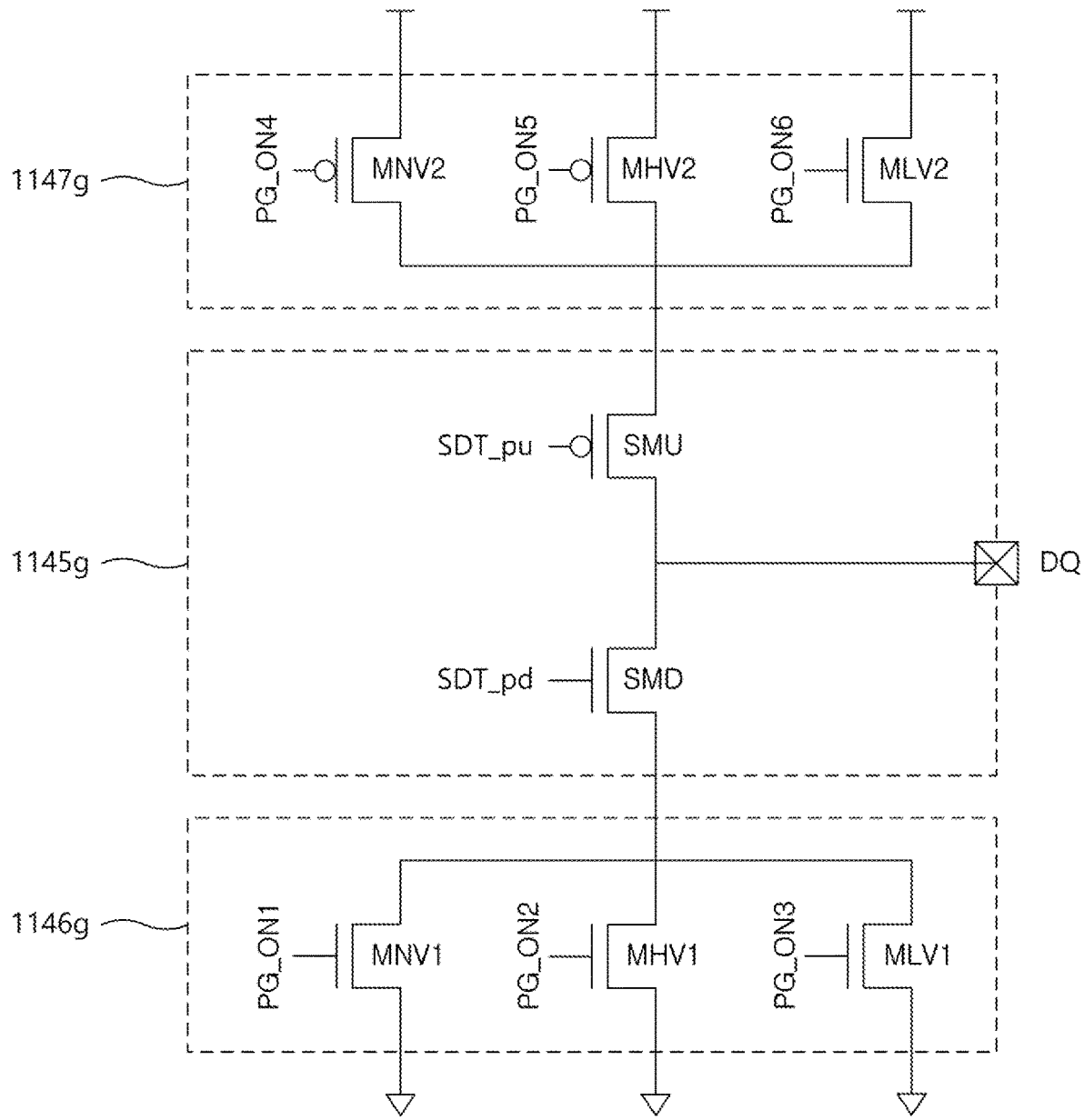
FIG. 10 a diagram illustrating another example of a first power gating circuit or a second power gating circuit of FIG. 3.

FIG. 10 is a diagram illustrating another example of a first power gating circuit or a second power gating circuit of FIG. 3. Referring to FIG. 10, a transmit circuit 1144g may include a driver 1145g, a first power gating circuit 1146g, and a second power gating circuit 1147g. For convenience of description, the transmit circuit 1144g that includes both the first power gating circuit 1146g and the second power gating circuit 1147g is illustrated in FIG. 10; however, the transmit circuit 1144g may include only the first power gating circuit 1146g, may include only the second power gating circuit 1147g, or may include both the first power gating circuit 1146g and the second power gating circuit 1147g.

According to an example embodiment, the driver 1145g may include the pull-down transistor SMD and the pull-up transistor SMU. Threshold voltage characteristics and operating characteristics of the pull-down transistor SMD and the pull-up transistor SMU are identical to those of the pull-down transistor SMD and the pull-up transistor SMU of FIG. 8, and thus, additional description will be omitted to avoid redundancy.

According to an example embodiment, the first power gating circuit 1146g may include a plurality of power gating transistors that are electrically connected in parallel. For example, the first power gating circuit 1146g may include at least two of a first normal transistor MNV1, a first high transistor MHV1, and a first low transistor MLV1. Each of the first normal transistor MNV1, the first high transistor MHV1, and the first low transistor MLV1 may be connected between the pull-down transistor SMD and the ground terminal. The first normal transistor MNV1 may be turned on based on the first power gating voltage PG_ON1. The first high transistor MHV1 may be turned on based on the second power gating voltage PG_ON2. The first low transistor MLV1 may be turned on based on the third power gating voltage PG_ON3. As an example, each of the first normal transistor MNV1, the first high transistor MHV1, and the first low transistor MLV1 may be implemented with an NMOS transistor.

According to an example embodiment, threshold voltage characteristics and operating characteristics of the first normal transistor MNV1, the first high transistor MHV1, and the first low transistor MLV1 are identical to those of the first normal transistor MNV1, the first high transistor MHV1, and the first low transistor MLV1 of FIG. 7, and thus, additional description will be omitted to avoid redundancy.

According to an example embodiment, the second power gating circuit 1147g may include a plurality of power gating transistors that are electrically connected in parallel. For example, the second power gating circuit 1147g may include at least two of a second normal transistor MNV2, a second high transistor MHV2, and a second low transistor MLV2. Each of the second normal transistor MNV2, the second high transistor MHV2, and the second low transistor MLV2 may be connected between the power terminal and the pull-up transistor SMU. The second normal transistor MNV2 may be turned on based on the fourth power gating voltage PG_ON4. The second high transistor MHV2 may be turned on based on the fifth power gating voltage PG_ON5. The second low transistor MLV2 may be turned on based on the sixth power gating voltage PG_ON6. As an example, each of the second normal transistor MNV2 and the second high transistor MHV2 may be implemented with a PMOS transistor. The second low transistor MLV2 may be implemented with an NMOS transistor.

According to an example embodiment, threshold voltage characteristics and operating characteristics of the second normal transistor MNV2, the second high transistor MHV2, and the second low transistor MLV2 are identical to those of the second normal transistor MNV2, the second high transistor MHV2, and the second low transistor MLV2 of FIG. 9, and thus, additional description will be omitted to avoid redundancy.

Figure 11:
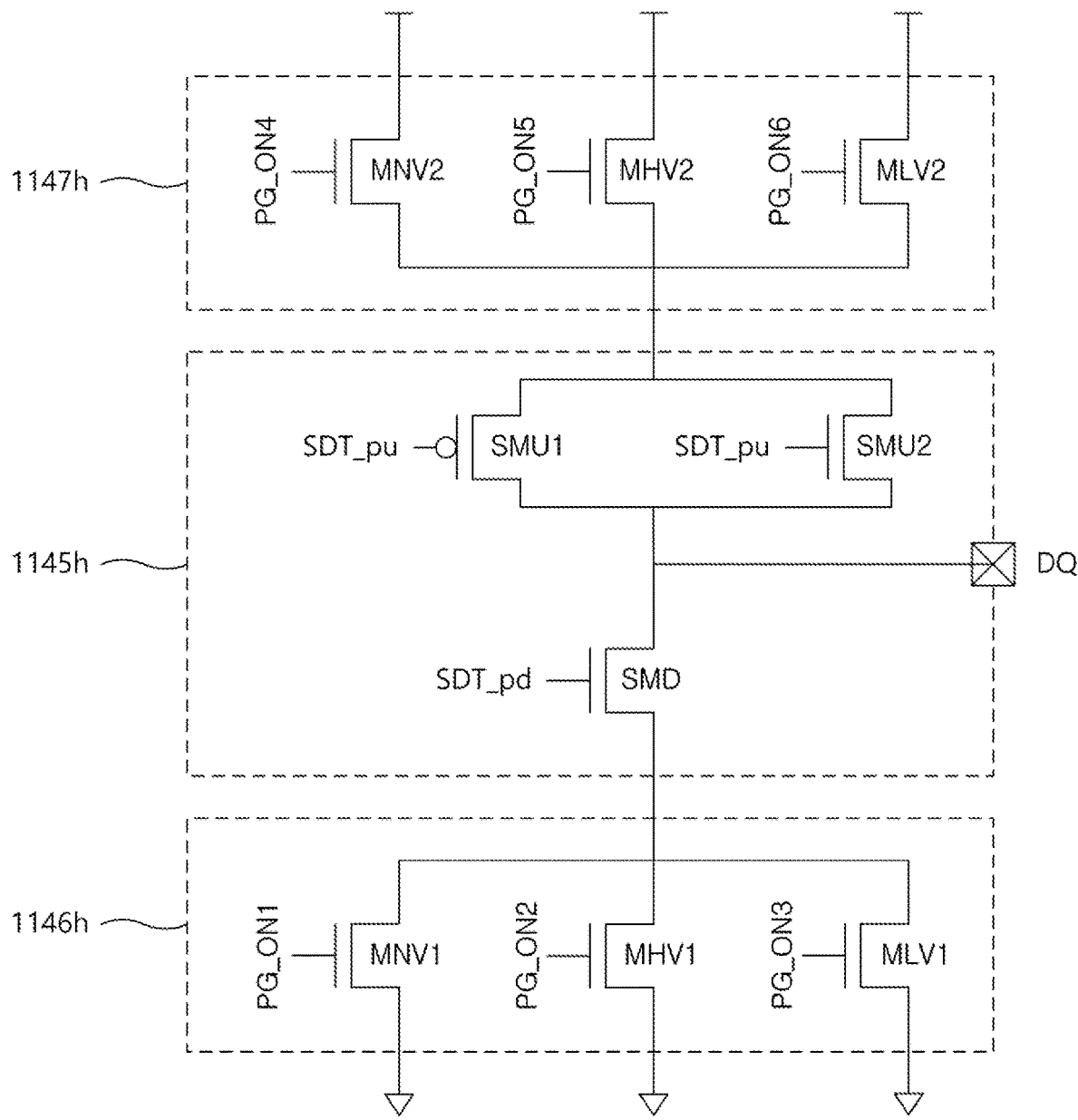
FIG. 11 a diagram illustrating another example of a first power gating circuit or a second power gating circuit of FIG. 3.

FIG. 11 is a diagram illustrating another example of a first power gating circuit or a second power gating circuit of FIG. 3. Referring to FIG. 11, a transmit circuit 1144h may include a driver 1145h, a first power gating circuit 1146h, and a second power gating circuit 1147h. For convenience of description, the transmit circuit 1144h that includes both the first power gating circuit 1146h and the second power gating circuit 1147h is illustrated in FIG. 11; however, the transmit circuit 1144h may include only the first power gating circuit 1146h, may include only the second power gating circuit 1147h, or may include both the first power gating circuit 1146h and the second power gating circuit 1147h.

According to an example embodiment, the driver 1145h may include the pull-down transistor SMD, a first pull-up transistor SMU1, and a second pull-up transistor SMU2. For example, the pull-down transistor SMD may be connected between the data line DQ and the first power gating circuit 1146h. Alternatively, in the case where the first power gating circuit 1146h is not provided, the pull-down transistor SMD may be connected between the data line DQ and the ground terminal. The pull-down transistor SMD may be implemented with an NMOS transistor. The pull-down transistor SMD may be turned on based on the pull-down signal SDT_pd of the serial data. The first pull-up transistor SMU1 and the second pull-up transistor SMU2 may be connected in parallel between the second power gating circuit 1147h and the data line DQ. The first pull-up transistor SMU1 may be implemented with a PMOS transistor. The second pull-up transistor SMU2 may be implemented with an NMOS transistor. The first pull-up transistor SMU1 and the second pull-up transistor SMU2 may be turned on based on the pull-up signal SDT_pu of the serial data. The first pull-up transistor SMU1 and the second pull-up transistor SMU2 may have different threshold voltages or different sizes. The first pull-up transistor SMU1 and the second pull-up transistor SMU2 may be simultaneously used, or one of the first pull-up transistor SMU1 and the second pull-up transistor SMU2 may be selectively used. The greatest threshold voltage among the threshold voltages of the pull-down transistor SMD, the first pull-up transistor SMU1, and the second pull-up transistor SMU2 may be referred to as the "first threshold voltage".

According to an example embodiment, configurations and characteristics of the first power gating circuit 1146h and the second power gating circuit 1147h are identical to those of the first power gating circuit 1146d and the second power gating circuit 1147d of FIG. 7, and thus, additional description will be omitted to avoid redundancy.

Figure 12:
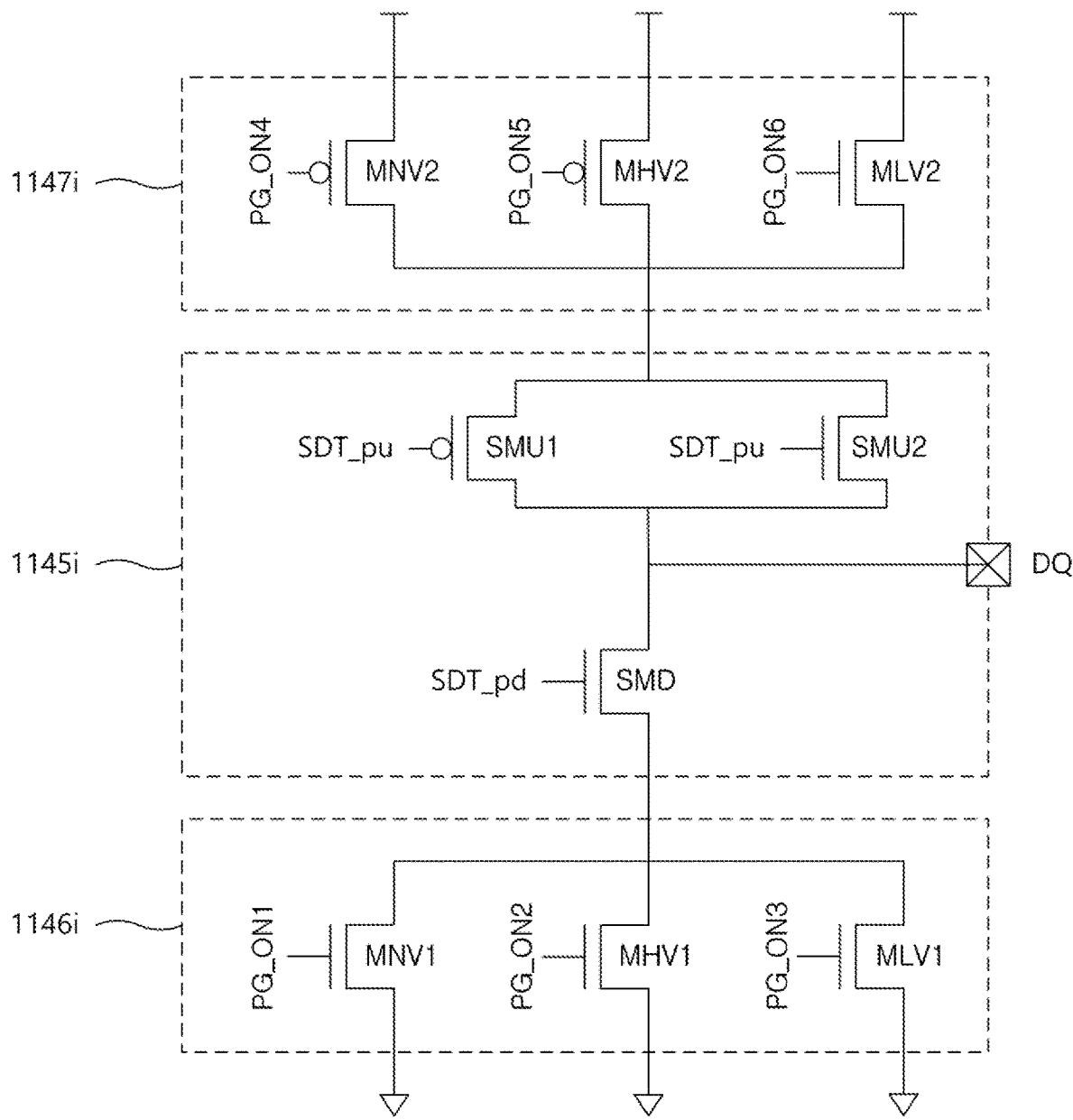
FIG. 12 is a diagram illustrating another example of a first power gating circuit or a second power gating circuit of FIG. 3.

FIG. 12 is a diagram illustrating another example of a first power gating circuit or a second power gating circuit of FIG. 3. Referring to FIG. 12, a transmit circuit 1144i may include a driver 1145i, a first power gating circuit 1146i, and a second power gating circuit 1147i. For convenience of description, the transmit circuit 1144i that includes both the first power gating circuit 1146i and the second power gating circuit 1147i is illustrated in FIG. 12; however, the transmit circuit 1144h may include only the first power gating circuit 1146i, may include only the second power gating circuit 1147i, or may include both the first power gating circuit 1146i and the second power gating circuit 1147i.

According to an example embodiment, a configuration and a characteristic of the driver 1145i are identical to those of the driver 1145h of FIG. 11; thus, additional description will be omitted to avoid redundancy. Configurations and characteristics of the first power gating circuit 1146i and the second power gating circuit 1147i are identical to those of the first power gating circuit 1146g and the second power gating circuit 1147g of FIG. 10; thus, additional description will be omitted to avoid redundancy.

Figure 13A:
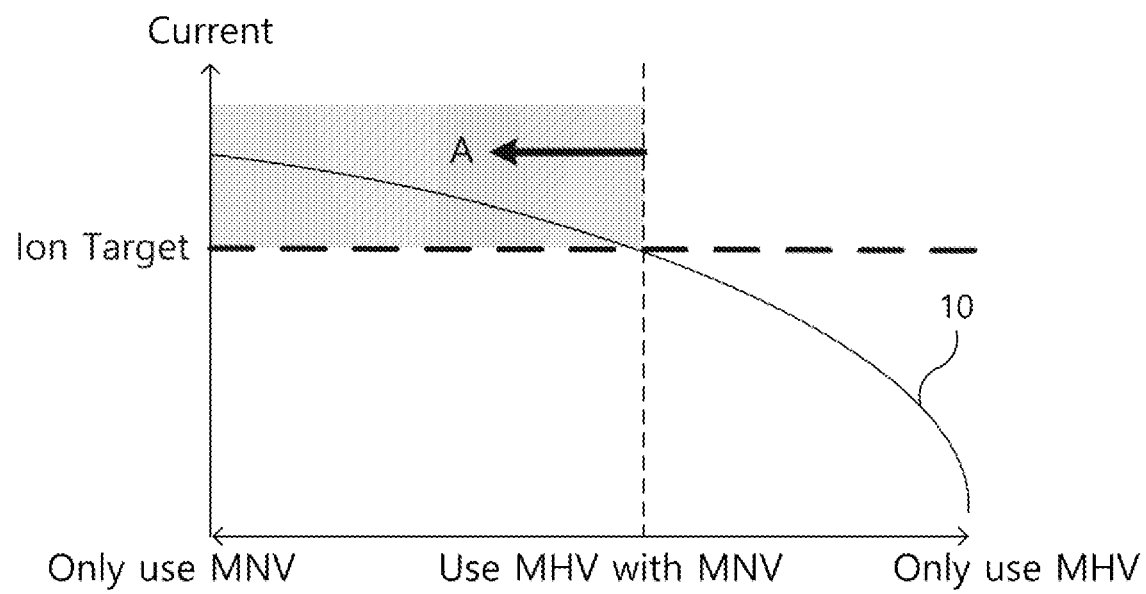
FIG. 13A is a graph illustrating an operating current of the transmit circuit 1144 of FIG. 3.
Figure 13B:
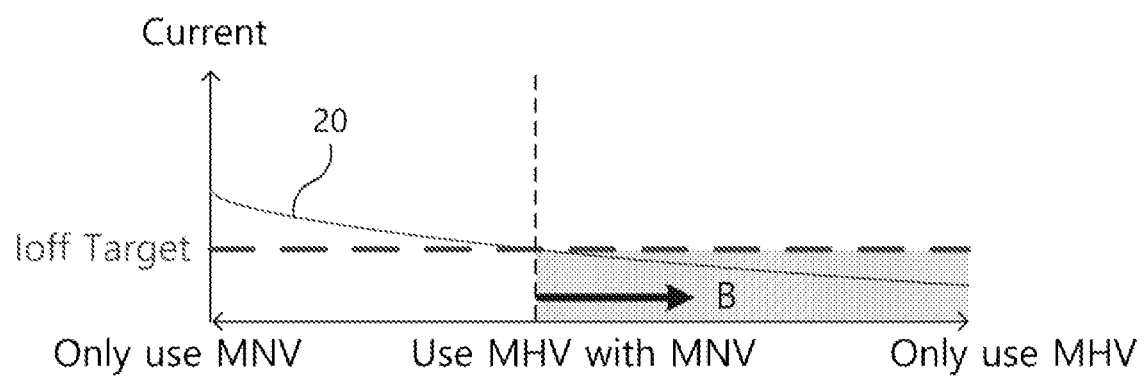
FIG. 13B is a graph illustrating a leakage current of the transmit circuit 1144 of FIG. 3.

FIG. 13A and FIG. 13B are graphs illustrating an operating current and a leakage current of a transmit circuit according to a configuration of a power gating transistor included in a power gating circuit according to an example embodiment. Referring to FIG. 13A, a first graph 10 may indicate an operating current Ion of the transmit circuit 1144 of FIG. 3. Referring to FIG. 13B, a second graph 20 may indicate a leakage current Ioff of the transmit circuit 1144 of FIG. 3. In the first graph 10 and the second graph 20, a vertical axis represents a current value, and a horizontal axis represents a configuration of power gating transistors used in the transmit circuit 1144. In the first graph 10 and the second graph 20, the leftmost indicates the case where only a normal transistor MNV (e.g., the first normal transistor MNV1 or the second normal transistor MNV2 of FIG. 4) is used in the power gating circuit, the rightmost indicates the case where only a high transistor MHV (e.g., the first high transistor MHV1 or the second high transistor MHV2 of FIG. 4) is used in the power gating circuit, and the center represents the case where the normal transistor MNV and the high transistor MHV are used in parallel. The high transistor MHV means a power gating transistor, the threshold voltage of which is higher than that of the normal transistor MNV.

According to an example embodiment, it is understood from the first graph 10 that, when only the high transistor MHV is used, the operating current Ion does not reach a target operating current Ion Target. In this case, the transmit circuit 1144 fails to operate. It is understood from the first graph 10 that, when only the normal transistor MNV is used, the operating current Ion exceeds the target operating current Ion Target. In this case, the transmit circuit 1144 may operate (zone A). However, referring to the second graph 20, when only the high transistor MHV is used, the leakage current Ioff may be limited to be smaller in amount than a target leakage current Ioff Target (Zone B). Referring to the second graph 20, when only the normal transistor MNV is used, the leakage current Ioff may occur to be greater in amount than the target leakage current Ioff Target. That is, when only the high transistor MHV is used, the leakage current Ioff may be prevented, but the performance of the transmit circuit 1144 may be reduced; when only the normal transistor MNV is used, the performance of the transmit circuit 1144 may be improved, but the leakage current Ioff may occur (i.e., may be greater in amount than the target leakage current Ioff Target).

According to an example embodiment, when the power gating circuit includes the normal transistor MNV and the high transistor MHV connected in parallel, the transmit circuit 1144 may operate with target performance, and the leakage current Ioff may be managed to be lower than or equal to the target leakage current Ioff Target. For example, a ratio (e.g., a size/driving capability ratio) of the normal transistor MNV and the high transistor MHV may be determined in a period where zone A of the first graph 10 and zone B of the second graph 20 overlap each other.

According to the present disclosure, a leakage current that occurs in an input/output circuit of a nonvolatile memory device in the process of transferring data may be blocked.

Also, according to the present disclosure, the increase in the area according to the improvement of performance of a power gating circuit added to block the leakage current may be reduced (or minimized or alleviated).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An input/output circuit of a nonvolatile memory device, comprising:
 a driver connected to a data line and configured to output data from a memory cell of the nonvolatile memory device to the data line; and
 a power gating circuit connected between the driver and a power terminal or between the driver and a ground terminal and configured to block a leakage current of the driver,
 wherein the power gating circuit includes a plurality of transistors electrically connected in parallel and having threshold voltages of different magnitudes, respectively, and
 wherein the driver includes a plurality of transistors each connected to the data line and configured to be turned on based on a signal corresponding to the data.

2. The input/output circuit as claimed in claim 1, wherein the plurality of transistors of the driver includes:
 a pull-down transistor connected to the data line and configured to be turned on based on a pull-down signal of the data; and
 a pull-up transistor connected to the data line and configured to be turned on based on a pull-up signal of the data,
 wherein the power gating circuit is connected between the pull-down transistor and the ground terminal.

3. The input/output circuit as claimed in claim 2, wherein the power gating circuit includes:
 a first transistor having a second threshold voltage greater than a first threshold voltage of the pull-down transistor; and
 a second transistor having a third threshold voltage greater than the second threshold voltage,
 wherein a drain of the first transistor and a drain of the second transistor are connected to a source of the pull-down transistor, and
 wherein a source of the first transistor and a source of the second transistor are connected to the ground terminal.

4. The input/output circuit as claimed in claim 2, wherein the power gating circuit includes:

a first transistor having a second threshold voltage greater than a first threshold voltage of the pull-down transistor; and
a third transistor having a fourth threshold voltage smaller than the second threshold voltage,
wherein a drain of the first transistor and a drain of the third transistor are connected to a source of the pull-down transistor, and
wherein a source of the first transistor and a source of the third transistor are connected to the ground terminal.

5. The input/output circuit as claimed in claim 2, wherein the power gating circuit includes:
a first transistor having a second threshold voltage greater than a first threshold voltage of the pull-down transistor;
a second transistor having a third threshold voltage greater than the second threshold voltage; and
a third transistor having a fourth threshold voltage smaller than the second threshold voltage,
wherein a drain of the first transistor, a drain of the second transistor, and a drain of the third transistor are connected to a source of the pull-down transistor, and
wherein a source of the first transistor, a source of the second transistor, and a source of the third transistor are connected to the ground terminal.

6. The input/output circuit as claimed in claim 1, wherein the plurality of transistors of the driver includes:
a pull-down transistor connected to the data line and configured to be turned on based on a pull-down signal of the data; and
a pull-up transistor connected to the data line and configured to be turned on based on a pull-up signal of the data,
wherein the power gating circuit is connected between the power terminal and the pull-up transistor.

7. The input/output circuit as claimed in claim 6, wherein the power gating circuit includes:
a first transistor having a second threshold voltage greater than a first threshold voltage of the pull-up transistor; and
a second transistor having a third threshold voltage greater than the second threshold voltage,
wherein a drain of the first transistor and a drain of the second transistor are connected to the power terminal, and
wherein a source of the first transistor and a source of the second transistor are connected to a drain of the pull-up transistor.

8. The input/output circuit as claimed in claim 6, wherein the power gating circuit includes:
a first transistor having a second threshold voltage greater than a first threshold voltage of the pull-up transistor; and
a third transistor having a fourth threshold voltage smaller than the second threshold voltage,
wherein a drain of the first transistor and a drain of the third transistor are connected to the power terminal, and
wherein a source of the first transistor and a source of the third transistor are connected to a drain of the pull-up transistor.

9. The input/output circuit as claimed in claim 6, wherein the power gating circuit includes:
a first transistor having a second threshold voltage greater than a first threshold voltage of the pull-up transistor;
a second transistor having a third threshold voltage greater than the second threshold voltage; and
a third transistor having a fourth threshold voltage smaller than the second threshold voltage,
wherein a drain of the first transistor, a drain of the second transistor, and a drain of the third transistor are connected to the power terminal, and
wherein a source of the first transistor, a source of the second transistor, and a source of the third transistor are connected to a drain of the pull-up transistor.

10. A nonvolatile memory device, comprising:
a memory cell array including a plurality of memory cells;
a page buffer connected to the memory cell array through bit lines and configured to read data stored in the plurality of memory cells through the bit lines;
an input/output circuit including a transmit circuit configured to output the data from the page buffer to a data line; and
control logic configured to control the page buffer and the input/output circuit such that the data are transferred through the transmit circuit,
wherein the transmit circuit includes:
a driver including a pull-down transistor configured to be turned on based on a pull-down signal of the data and a pull-up transistor configured to be turned on based on a pull-up signal of the data, and the driver configured to output the data to the data line; and
a power gating circuit configured to block a leakage current of the pull-down transistor or the pull-up transistor,
wherein the pull-down transistor and the pull-up transistor of the driver are connected to the data line,
wherein the power gating circuit includes:
a first transistor having a second threshold voltage greater than a first threshold voltage of the pull-down transistor or the pull-up transistor; and
at least one second transistor having a threshold voltage different in magnitude from the second threshold voltage, and
wherein the first transistor and the at least one second transistor are electrically connected in parallel.

11. The nonvolatile memory device as claimed in claim 10, wherein the pull-up transistor includes a positive metal-oxide semiconductor (PMOS) transistor.

12. The nonvolatile memory device as claimed in claim 11,
wherein the power gating circuit is connected between the driver and a power terminal,
wherein the threshold voltage of the at least one second transistor of the power gating circuit is a third threshold voltage greater than the second threshold voltage,
wherein a drain of the first transistor and a drain of the at least one second transistor are connected to the power terminal, and
wherein a source of the first transistor and a source of the at least one second transistor are connected to a drain of the pull-up transistor.

13. The nonvolatile memory device as claimed in claim 12,
wherein the first transistor is configured to be turned on based on a first power gating voltage, and
wherein the at least one second transistor is configured to be turned on based on a second power gating voltage greater than the first power gating voltage.

14. The nonvolatile memory device as claimed in claim 11,
wherein the power gating circuit is connected between the driver and a power terminal, wherein the threshold voltage of the at least one second transistor of the power gating circuit is a fourth threshold voltage smaller than the second threshold voltage, wherein a drain of the first transistor and a drain of the at least one second transistor are connected to the power terminal, and wherein a source of the first transistor and a source of the at least one second transistor are connected to a drain of the pull-up transistor.

15. The nonvolatile memory device as claimed in claim 14, wherein the first transistor is configured to be turned on in response to a first power gating voltage applied at a first timing, and wherein the at least one second transistor is configured to be turned on in response to a second power gating voltage applied at a second timing earlier than the first timing.

16. A nonvolatile memory device, comprising:

a memory cell array including a plurality of memory cells;

a page buffer connected to the memory cell array through bit lines and configured to read data stored in the plurality of memory cells through the bit lines;

an input/output circuit including a transmit circuit configured to output the data from the page buffer to a data line; and control logic configured to control the page buffer and the input/output circuit such that the data are transferred through the transmit circuit, wherein the transmit circuit includes:

a pull-down transistor connected to the data line and configured to be turned on based on a pull-down signal of the data;

a first pull-up transistor connected to the data line and configured to be turned on based on a pull-up signal of the data;

a second pull-up transistor connected to the data line and configured to be turned on based on the pull-up signal of the data; and a power gating circuit configured to block leakage currents of the first pull-up transistor and the second pull-up transistor, wherein the power gating circuit includes:

a first transistor having a second threshold voltage greater than a first threshold voltage of the first pull-up transistor or the second pull-up transistor; and at least one second transistor having a threshold voltage different in magnitude from the second threshold voltage, wherein the first transistor and the at least one second transistor are electrically connected in parallel, wherein a first end of the first pull-up transistor and a first end of the second pull-up transistor are connected to the data line, and wherein a second end of the first pull-up transistor and a second end of the second pull-up transistor are connected to the power gating circuit.

17. The nonvolatile memory device as claimed in claim 16, wherein the threshold voltage of the at least one second transistor included in the power gating circuit is a third threshold voltage greater than the second threshold voltage, wherein the power gating circuit is connected between the first and second pull-up transistors and a power terminal, wherein a drain of the first transistor and a drain of the at least one second transistor are connected to the power terminal, and wherein a source of the first transistor and a source of the at least one second transistor are respectively connected to the second end of the first pull-up transistor and the second end of the second pull-up transistor.

18. The nonvolatile memory device as claimed in claim 17, wherein each of the first transistor and the at least one second transistor includes a positive metal-oxide semiconductor (PMOS) transistor.

19. The nonvolatile memory device as claimed in claim 17, wherein each of the first transistor and the at least one second transistor includes a negative metal-oxide semiconductor (NMOS) transistor.

20. The nonvolatile memory device as claimed in claim 16, wherein the first pull-up transistor includes a positive metal oxide semiconductor (PMOS) transistor, wherein the second pull-up transistor includes a negative metal-oxide semiconductor (NMOS) transistor, and wherein the first pull-up transistor and the second pull-up transistor are simultaneously used or are selectively used.

* * * * *